(12) United States Patent
Chandrasekharan et al.

(10) Patent No.: US 9,677,176 B2
(45) Date of Patent: Jun. 13, 2017

(54) MULTI-PLENUM, DUAL-TEMPERATURE SHOWERHEAD

(71) Applicant: Novellus Systems, Inc., Fremont, CA (US)

(72) Inventors: Ramesh Chandrasekharan, Portland, OR (US); Jennifer L. Petraglia, Portland, OR (US)

(73) Assignee: Novellus Systems, Inc., Fremont, CA (US)

( * ) Notice: Subject to any disclaimer, the term of this patent is extended or adjusted under 35 U.S.C. 154(b) by 814 days.

(21) Appl. No.: 13/934,597

(22) Filed: Jul. 3, 2013

(65) Prior Publication Data
US 2015/0007770 A1 Jan. 8, 2015

(51) Int. Cl.
 *C23C 16/455* (2006.01)
 *B05B 1/18* (2006.01)

(52) U.S. Cl.
 CPC ......... *C23C 16/45572* (2013.01); *B05B 1/18* (2013.01); *C23C 16/45565* (2013.01); *C23C 16/45574* (2013.01)

(58) Field of Classification Search
 CPC ........ C23C 16/45572; C23C 16/45574; C23C 16/45565; B05B 1/18
 USPC .................. 118/715; 156/345.33, 345.34
 See application file for complete search history.

(56) References Cited

U.S. PATENT DOCUMENTS

| | | | |
|---|---|---|---|
| 5,614,026 A | | 3/1997 | Williams |
| 5,871,586 A | * | 2/1999 | Crawley ........... C23C 16/45514 118/715 |
| 5,919,382 A | * | 7/1999 | Qian ................. H01J 37/32082 118/723 I |
| 6,036,878 A | * | 3/2000 | Collins ................. H01J 37/321 216/68 |
| 6,054,013 A | * | 4/2000 | Collins ................. H01J 37/321 118/723 I |
| 6,059,885 A | * | 5/2000 | Ohashi ................ C23C 16/4401 118/715 |
| 6,089,472 A | * | 7/2000 | Carter ................... C23C 16/455 239/422 |
| 6,148,761 A | | 11/2000 | Majewski et al. |

(Continued)

FOREIGN PATENT DOCUMENTS

| | | |
|---|---|---|
| CN | 1574229 A | 2/2005 |
| CN | 101423936 A | 5/2009 |

(Continued)

OTHER PUBLICATIONS

U.S. Appl. No. 13/842,054, filed Mar. 15, 2013, entitled "Radical Source Design for Remote Plasma Atomic Layer Deposition."

(Continued)

*Primary Examiner* — Rudy Zervigon
(74) *Attorney, Agent, or Firm* — Weaver Austin Villeneuve & Sampson LLP

(57) ABSTRACT

A dual-temperature, multi-plenum showerhead for use in semiconductor processing equipment is described. The showerhead may supply multiple separate gases to a wafer reaction area while keeping the gases largely segregated within the showerhead. Additionally, the showerhead may be configured to allow a faceplate of the showerhead to be maintained at a significantly higher temperature than the rest of the showerhead.

24 Claims, 15 Drawing Sheets

(56) References Cited

U.S. PATENT DOCUMENTS

| | | | |
|---|---|---|---|
| 6,200,412 B1* | 3/2001 | Kilgore | C23C 16/4405 118/715 |
| 6,291,793 B1* | 9/2001 | Qian | H01J 37/32082 118/723 I |
| 6,387,182 B1* | 5/2002 | Horie | C23C 16/409 118/244 |
| 6,387,207 B1 | 5/2002 | Janakiraman et al. | |
| 6,565,661 B1* | 5/2003 | Nguyen | C23C 16/4557 118/715 |
| 6,727,654 B2* | 4/2004 | Ogawa | H01J 37/32009 118/723 I |
| 6,782,843 B2 | 8/2004 | Kinnard et al. | |
| 7,296,534 B2* | 11/2007 | Fink | H01J 37/32532 118/723 E |
| 7,479,303 B2* | 1/2009 | Byun | C23C 16/45519 118/715 |
| 7,846,291 B2* | 12/2010 | Otsuki | C23C 16/4404 118/723 R |
| 7,931,749 B2* | 4/2011 | Amikura | C23C 16/45565 118/715 |
| 8,083,853 B2 | 12/2011 | Choi et al. | |
| 8,231,799 B2* | 7/2012 | Bera | H01J 37/32082 118/715 |
| 8,298,370 B2* | 10/2012 | Byun | C23C 16/45519 118/715 |
| 8,308,865 B2* | 11/2012 | Kim | C23C 16/45514 118/715 |
| 8,328,939 B2 | 12/2012 | Choi et al. | |
| 8,361,275 B2* | 1/2013 | Tahara | H01J 37/32935 118/715 |
| 8,361,892 B2* | 1/2013 | Tam | C23C 16/45519 118/715 |
| 8,419,959 B2 | 4/2013 | Bettencourt et al. | |
| 8,512,509 B2* | 8/2013 | Bera | H01J 37/321 118/715 |
| 8,679,956 B2* | 3/2014 | Tam | C23C 16/45519 118/715 |
| 8,721,791 B2* | 5/2014 | Tiner | C23C 16/45565 118/715 |
| 8,764,902 B2* | 7/2014 | Suzuki | C23C 16/45565 118/715 |
| 8,869,742 B2 | 10/2014 | Dhindsa et al. | |
| 8,882,913 B2* | 11/2014 | Byun | C23C 16/40 118/715 |
| 9,057,128 B2* | 6/2015 | Olgado | C23C 16/45565 |
| 9,315,897 B2* | 4/2016 | Byun | C23C 16/45572 |
| 9,349,619 B2* | 5/2016 | Kawamata | H01L 21/3065 |
| 9,441,791 B2* | 9/2016 | Mizusawa | G05D 11/132 |
| 9,476,121 B2* | 10/2016 | Byun | C23C 16/40 |
| 2005/0000430 A1 | 1/2005 | Jang et al. | |
| 2005/0092248 A1* | 5/2005 | Lee | C23C 16/45565 118/715 |
| 2005/0241765 A1* | 11/2005 | Dhindsa | H01J 37/32009 156/345.34 |
| 2005/0241767 A1 | 11/2005 | Ferris et al. | |
| 2006/0021703 A1* | 2/2006 | Umotoy | C23C 16/45565 156/345.34 |
| 2006/0191637 A1* | 8/2006 | Zajac | B81C 1/00547 156/345.34 |
| 2006/0228496 A1 | 10/2006 | Choi et al. | |
| 2006/0263522 A1* | 11/2006 | Byun | C23C 16/45519 427/248.1 |
| 2007/0068798 A1 | 3/2007 | Honda et al. | |
| 2007/0110918 A1 | 5/2007 | Yuda et al. | |
| 2007/0163440 A1* | 7/2007 | Kim | C23C 16/45565 96/52 |
| 2007/0215048 A1 | 9/2007 | Suzuki et al. | |
| 2007/0272154 A1* | 11/2007 | Amikura | C23C 16/45565 118/719 |
| 2008/0020146 A1 | 1/2008 | Choi et al. | |
| 2008/0156264 A1* | 7/2008 | Fair | H01J 37/321 118/723 E |
| 2008/0156631 A1 | 7/2008 | Fair et al. | |
| 2009/0095222 A1* | 4/2009 | Tam | C23C 16/45565 118/723 R |
| 2009/0095621 A1 | 4/2009 | Kao et al. | |
| 2009/0098276 A1 | 4/2009 | Burrows et al. | |
| 2009/0169744 A1* | 7/2009 | Byun | C23C 16/40 427/255.28 |
| 2009/0178615 A1* | 7/2009 | Kim | C23C 16/45565 118/715 |
| 2009/0236313 A1* | 9/2009 | Qiu | H01J 37/3244 216/67 |
| 2009/0266911 A1* | 10/2009 | Kim | C23C 16/45514 239/265.11 |
| 2009/0320756 A1 | 12/2009 | Tanaka | |
| 2010/0003405 A1* | 1/2010 | Kappeler | C23C 16/45551 427/255.28 |
| 2010/0003406 A1 | 1/2010 | Lam et al. | |
| 2010/0184298 A1* | 7/2010 | Dhindsa | H01J 37/3244 438/710 |
| 2010/0263588 A1* | 10/2010 | Zhiyin | C23C 16/45508 117/98 |
| 2010/0300359 A1* | 12/2010 | Armour | C23C 16/45565 118/724 |
| 2011/0023782 A1* | 2/2011 | Han | C23C 16/45565 118/724 |
| 2011/0048325 A1* | 3/2011 | Choi | C23C 16/452 118/712 |
| 2011/0052833 A1* | 3/2011 | Hanawa | C23C 16/4404 427/534 |
| 2011/0073038 A1* | 3/2011 | Chien | C23C 16/45565 118/715 |
| 2011/0253044 A1* | 10/2011 | Tam | C23C 16/45519 118/666 |
| 2011/0256315 A1* | 10/2011 | Tam | C23C 16/45519 427/255.28 |
| 2011/0256692 A1* | 10/2011 | Tam | C23C 16/45519 438/478 |
| 2011/0308551 A1* | 12/2011 | Chung | B08B 5/00 134/22.1 |
| 2012/0052216 A1* | 3/2012 | Hanawa | C23C 16/45565 427/582 |
| 2012/0135609 A1 | 5/2012 | Yudovsky et al. | |
| 2012/0161405 A1 | 6/2012 | Mohn et al. | |
| 2013/0052804 A1* | 2/2013 | Song | C23C 16/45565 438/478 |
| 2013/0109159 A1* | 5/2013 | Carlson | C23C 16/45565 438/503 |
| 2013/0288485 A1* | 10/2013 | Liang | H01L 21/02282 438/782 |
| 2013/0341433 A1 | 12/2013 | Roy et al. | |
| 2014/0103145 A1* | 4/2014 | White | H01J 37/32449 239/548 |
| 2014/0179114 A1* | 6/2014 | van Schravendijk | C23C 16/455 438/758 |
| 2014/0235069 A1* | 8/2014 | Breiling | F28F 3/02 438/778 |
| 2014/0272185 A1* | 9/2014 | Na | C23C 16/34 427/535 |
| 2015/0007770 A1* | 1/2015 | Chandrasekharan | C23C 16/45565 118/715 |

FOREIGN PATENT DOCUMENTS

| | | |
|---|---|---|
| CN | 101423937 A | 5/2009 |
| CN | 102424956 A | 4/2012 |
| WO | WO 2011/044451 A2 | 4/2011 |
| WO | WO 2012/122054 A2 | 9/2012 |

OTHER PUBLICATIONS

U.S. Appl. No. 13/934,620, filed Jul. 3, 2013, entitled "Multi-Plenum Showerhead With Temperature Control."

US Office Action dated Dec. 3, 2015 issued in U.S. Appl. No. 13/842,054.

US Final Office Action dated May 18, 2016 issued in U.S. Appl. No. 13/842,054.

(56) References Cited

OTHER PUBLICATIONS

US Office Action dated Mar. 13, 2015 issued in U.S. Appl. No. 13/531,254.
US Office Action dated Sep. 17, 2015 issued in U.S. Appl. No. 13/531,254.
US Notice of Allowance dated Jan. 15, 2016 issued in U.S. Appl. No. 13/531,254.
US Notice of Allowance dated May 12, 2016 issued in U.S. Appl. No. 13/531,254.
Chinese First Office Action dated Dec. 9, 2015 issued in Application No. CN 201410052998.X.
Chinese Second Office Action dated Jul. 27, 2016 issued in Application No. CN 201410052998.X.
Singapore Search Report and Written Opinion dated Jul. 7, 2015 issued in Application No. SG 201401171-2.
Singapore Final Examination Report dated Jan. 12, 2016 issued in Application No. SG 201401171-2.
Chinese First Office Action dated Mar. 2, 2016 issued in Application No. CN 201410312720.1.

* cited by examiner

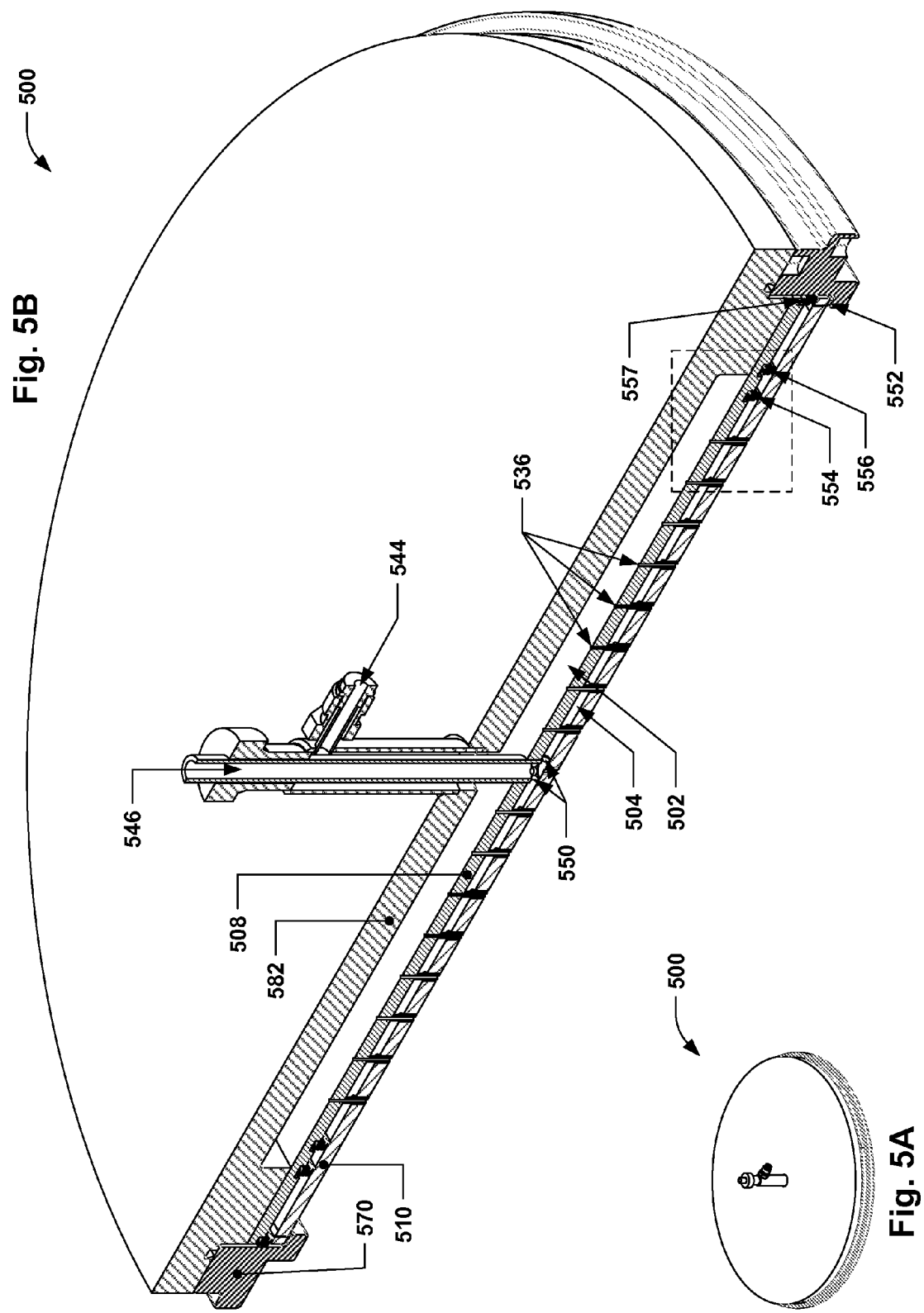

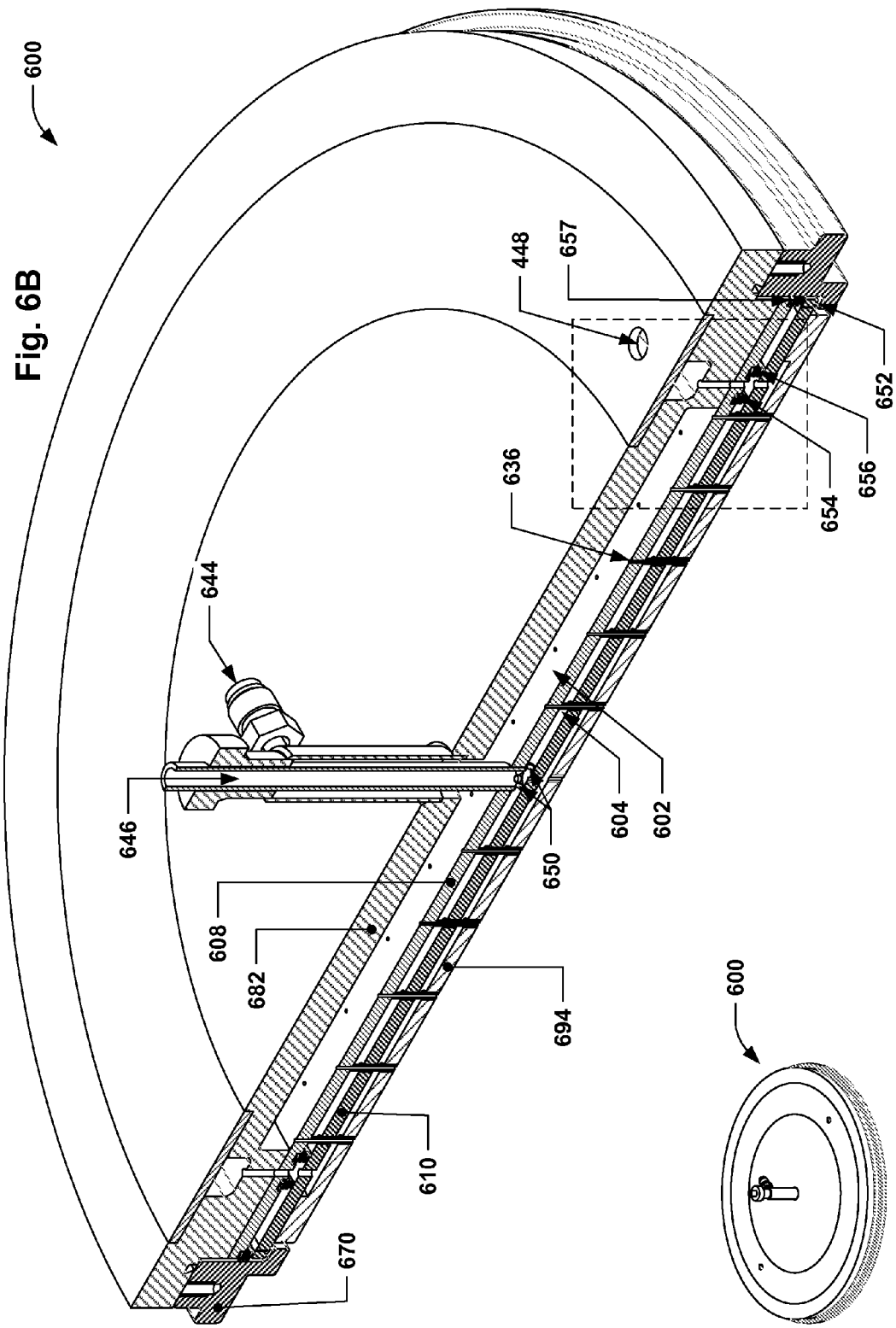

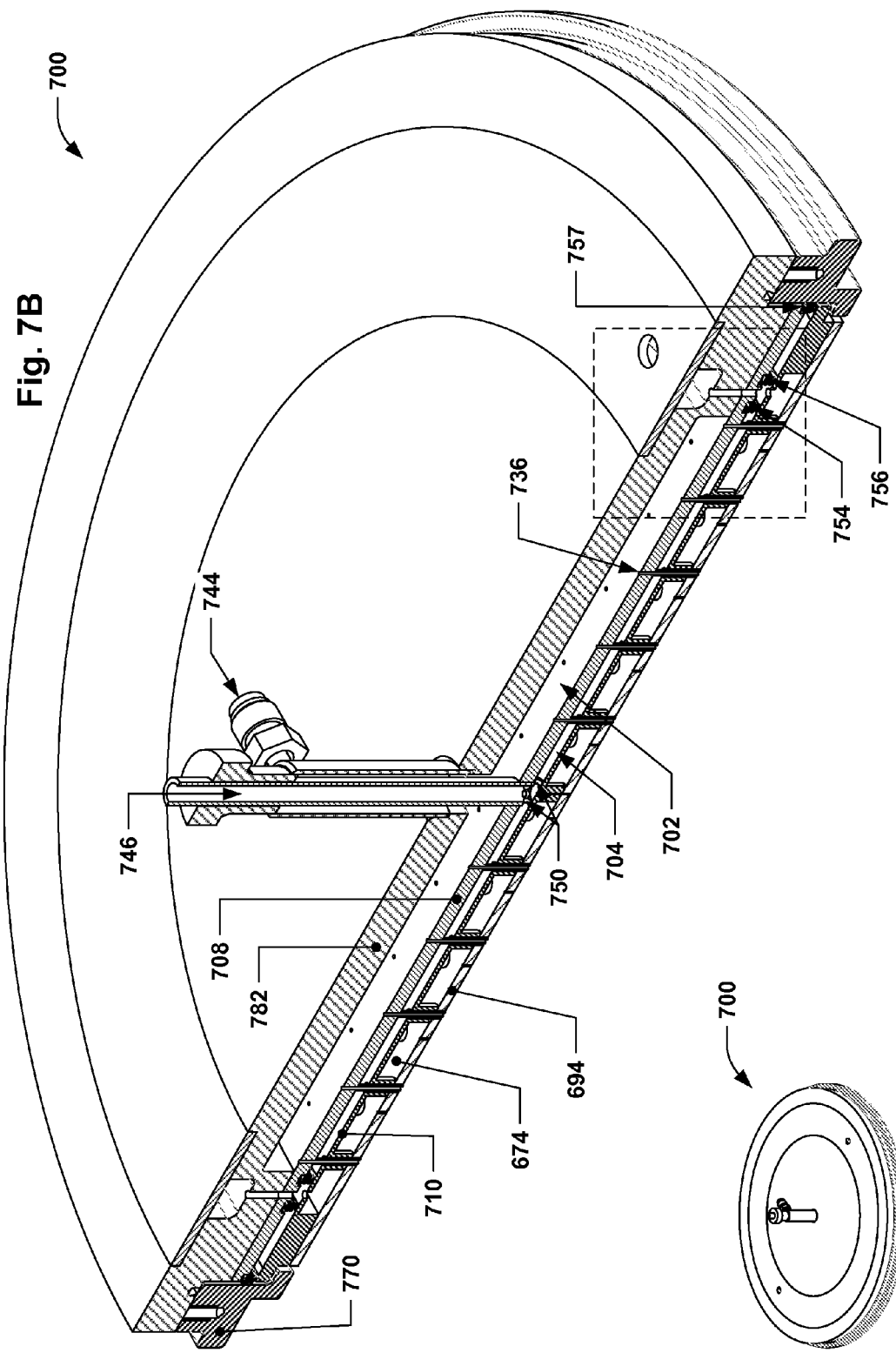

US 9,677,176 B2

MULTI-PLENUM, DUAL-TEMPERATURE SHOWERHEAD

BACKGROUND

In semiconductor processing equipment, a showerhead is often used to distribute process gases across a semiconductor wafer in a desired manner, e.g., in an evenly distributed manner. Such showerheads typically include a plenum that is bounded by a faceplate with a plurality of gas distribution holes that lead to the outside of the showerhead. The faceplate typically faces a wafer reaction area within a semiconductor processing or reaction chamber, and wafers are usually placed beneath the faceplate within the processing chamber, e.g., on a wafer support or pedestal that supports the wafer in a location below the faceplate.

SUMMARY

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

In some implementations, a showerhead for use in semiconductor processing equipment is provided. The showerhead may include a first plenum volume, a second plenum volume, a faceplate, and a plenum divider. The plenum divider may have a first side and a second side opposite the first side of the plenum divider and the faceplate may have a first side and a second side opposite the first side of the faceplate. The first side of the faceplate may face the second side of the plenum divider and may be offset from the second side of the plenum divider by a first distance to form a first gap. The first side of the plenum divider may partially bound the first plenum volume, and the second plenum volume may be located between the plenum divider and the faceplate within the first gap. The plenum divider may include a plurality of tubular structures that protrude from the second side of the plenum divider by a second distance, each tubular structure having an exterior surface and a first through-hole passing through the tubular structure and the plenum divider. Furthermore, the faceplate may include a plurality of second through-holes, each second through-hole corresponding to a different one of the tubular structures and having an interior surface offset from the exterior surface of the corresponding tubular structure by at least a third distance. The first distance may be less than the second distance, and the faceplate may be substantially conductively thermally isolated from the plenum divider.

In some such implementations, the faceplate and the plenum divider may be configured to have a thermal conductance of 0.05 W/(in$^2$K) or less between them.

In some implementations of the showerhead, the showerhead may further include a backplate. In such implementations, the first plenum volume may also be partially bounded by the backplate, and the backplate may include internal cooling passages and be configured to be actively cooled.

In some implementations, the plenum divider may include one or more internal cooling passages configured to circulate coolant within the plenum divider.

In some implementations, the showerhead may further include a plasma dome connected with a radio frequency generator and fluidly connected with a first gas inlet. The first plenum volume may also be partially bounded by the plasma dome, and the plasma dome and RF generator may be configured to generate a plasma within the first plenum volume using gas from the first gas inlet.

In some implementations, the faceplate may have a plurality of third through-holes in addition to the plurality of second through-holes, and the third through-holes may not have corresponding tubular structures.

In some implementations, the tubular structures may be substantially cylindrical, the first through-holes and the second through-holes may be substantially round, and the offset between the interior surface of each second through-hole and the exterior surface of each corresponding tubular structure may result in an annular gap region between the second through-hole and the corresponding tubular structure.

In some implementations of the showerhead, the third distance may be less than about 0.1". In other implementations of the showerhead, the third distance may be between about 0.005" and 0.020".

In some implementations of the showerhead, each tubular structure may terminate at a location substantially even with the second side of the faceplate proximate to the corresponding second through-hole.

In some implementations of the showerhead, the showerhead may further include a first gas inlet and a second gas inlet. The first gas inlet may be configured to supply gas to the first plenum volume and the second gas inlet may be configured to supply gas to the second plenum volume. The second gas inlet may be substantially tubular, may pass through the plenum divider, and may span between the first side of the faceplate and the second side of the plenum divider. The second gas inlet may also have a circular array of radial gas distribution holes, each radial gas distribution hole fluidly connecting the second gas inlet with the second plenum volume.

In some implementations, the showerhead may further include one or more low-contact-area (LCA) features and a first low-thermal-conductance barrier having an inner perimeter. The one or more LCA features may support the faceplate with respect to the plenum divider, and the first low-thermal-conductance barrier may be interposed between the faceplate and the plenum divider so as to span the first gap. The first low-thermal-conductance barrier may be positioned such that the second through-holes and the third through-holes are located within the inner perimeter of the first low-thermal-conductance barrier.

In some implementations of the showerhead, substantially all of the thermally conductive paths from the faceplate to other components of the showerhead may be provided by the one or more LCA features and the first low-thermal-conductance barrier.

In some implementations of the showerhead, the one or more LCA features may be provided by a plurality of posts spaced about the first low-thermal-conductance barrier, the posts configured to support the faceplate in tension.

In some implementations of the showerhead, the showerhead may further include a collar having an interior collar surface that is offset from the faceplate by at least a fourth distance and having an interior aperture smaller than the faceplate. The one or more LCA features may be provided by a plurality of LCA balls that support the second side of the faceplate in compression. The LCA balls may be located between the interior collar surface and the faceplate.

In some implementations of the showerhead, the showerhead may further include a second low-thermal-conductance barrier having an inner perimeter. The second low-thermal-conductance barrier may be interposed between the faceplate and the plenum divider so as to span the first gap and the first low-thermal-conductance barrier may be located within the inner perimeter of the second low-thermal-conductance barrier.

In some implementations of the showerhead, substantially all of the thermally-conductive paths from the faceplate to other components of the showerhead may be provided by the one or more LCA features, the first low-thermal-conductance barrier, and the second low-thermal-conductance barrier.

In some implementations of the showerhead, the third plenum volume may be at least partially defined by the first side of the faceplate, the second side of the plenum divider, the first low-thermal-conductance barrier, and the second low-thermal-conductance barrier. The faceplate may also include a plurality of internal flow passages and a plurality of third holes in the first side of the faceplate. In such implementations, each third hole may span between one of the internal flow passages and the first side of the faceplate and each third hole may exit the first side of the faceplate in a region between the first low-thermal-conductance barrier and the second low-thermal-conductance barrier.

In some implementations of the showerhead, the first plenum volume, the second plenum volume, and the third plenum volume may all be fed from separate gas inlets.

In some implementations of the showerhead, the second through-holes may intersect the internal flow passages and the second through-holes may thereby be in fluidic communication with the internal flow passages within the faceplate.

In some implementations, the faceplate may further include a plurality of fourth holes in the second side of the faceplate, and each fourth hole may span between one of the internal flow passages and the second side of the faceplate. In some such implementations, the fourth holes may be fluidly isolated from the second through-holes within the faceplate.

BRIEF DESCRIPTION OF THE DRAWINGS

FIG. 5A depicts an isometric view of one example of a dual-plenum, dual-temperature showerhead.

FIG. 5B depicts an isometric section view of the example of a dual-plenum, dual-temperature showerhead from FIG. 5A.

FIG. 6A depicts an isometric view of one example of a tri-plenum, dual-temperature showerhead.

FIG. 6B depicts an isometric section view of the example of a tri-plenum, dual-temperature showerhead from FIG. 6A.

FIG. 7A depicts an isometric view of another example of a tri-plenum, dual-temperature showerhead.

FIG. 7B depicts an isometric section view of the example of a tri-plenum, dual-temperature showerhead from FIG. 7A.

FIGS. 1A through 4 may not be drawn to scale. FIGS. 5A through 7D are drawn to scale.

DETAILED DESCRIPTION

Figure 1A:
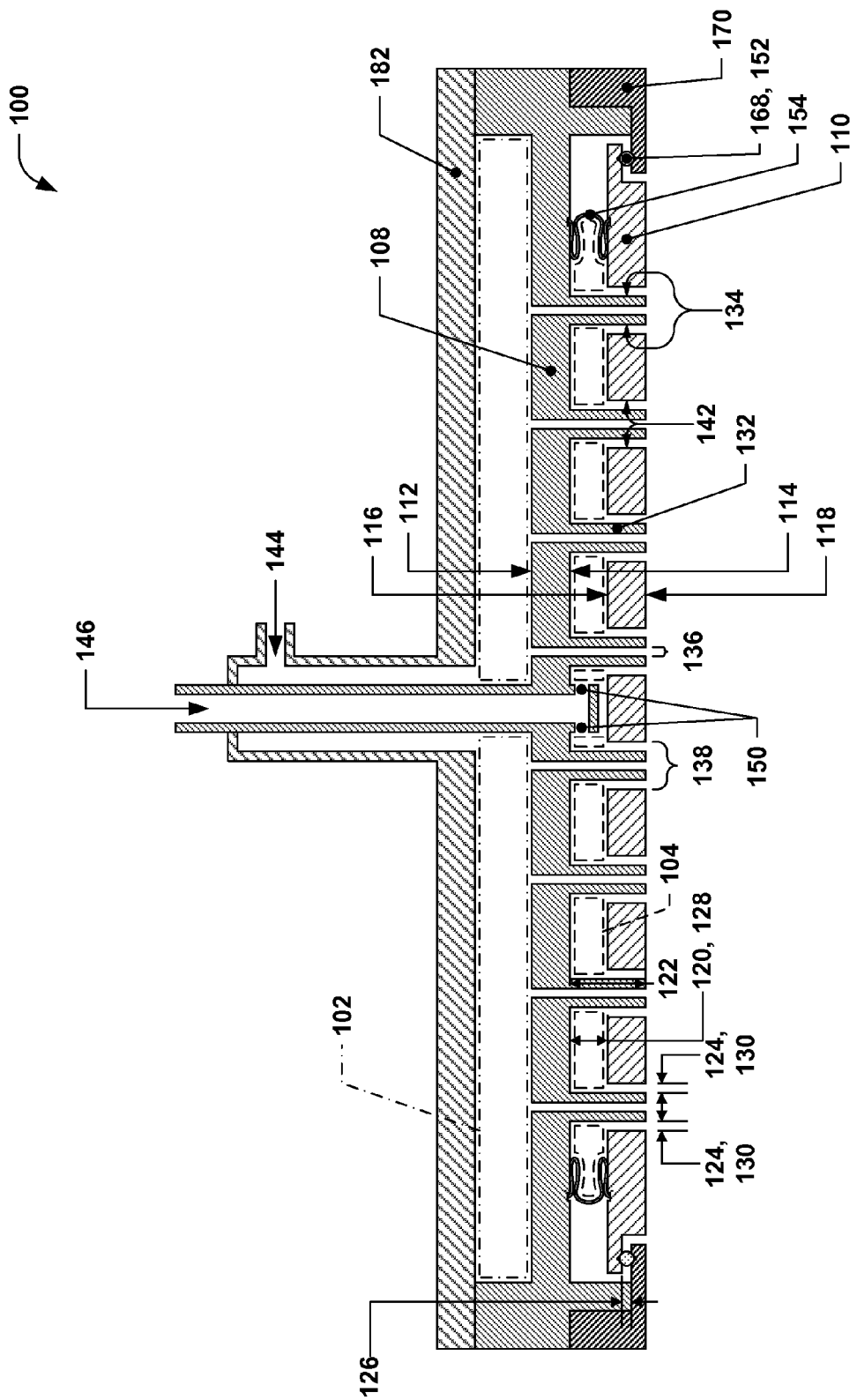
FIG. 1A depicts a conceptual cross-sectional schematic of an example of a multi-plenum, dual-temperature showerhead.

Examples of various implementations are illustrated in the accompanying drawings and described further below. It will be understood that the discussion herein is not intended to limit the claims to the specific implementations described. On the contrary, it is intended to cover alternatives, modifications, and equivalents as may be included within the spirit and scope of this disclosure as defined by the appended claims. In the following description, numerous specific details are set forth in order to provide a thorough understanding of the present disclosure. The present disclosure may be practiced without some or all of these specific details. In other instances, well-known process operations have not been described in detail in order not to unnecessarily obscure the present disclosure.

Described herein are various semiconductor processing showerheads designs that illustrate various design concepts that may be combined in various ways to provide a showerhead capable of separately providing two or more process gases to a wafer reaction area while keeping at least two of the two or more process gases at substantially different temperatures within the showerhead.

Several conventions have been adopted in many of the drawings and discussions in this disclosure. For example, reference is made at various points to "volumes," e.g., "plenum volumes." These volumes may be generally indicated in various Figures using dashed, dotted, or dashed-dotted lines. It is to be understood that such lines represent an approximation of such volumes, and that the actual volumes may extend, for example, to various solid surfaces that bound the volumes (for visibility, the lines representing such volumes in the Figures are offset slightly from the various structures that may define portions of a given volume). Various smaller volumes, e.g., gas inlets or other holes leading through an otherwise solid boundary surface of a plenum volume, may be fluidly connected to plenum volumes.

Additionally, the drawings often depict multiple, similar structures within a particular Figure. Due to space constraints, labeling each instance of a particular element within a Figure is generally not possible. Accordingly, while an element may be depicted multiple times within a Figure, it may only be called out once or twice. It is to be understood that unlabeled structures or elements similar to a labeled structure or element within a given Figure are to be recognized as also corresponding to that label.

It is to be understood that the use of relative terms such as "above," "on top," "below," "underneath," etc. are to be understood to refer to spatial relationships of components with respect to the orientations of those components during normal use of a showerhead, i.e., with the showerhead oriented so as to distribute gases downwards towards a wafer during wafer processing operations. Similarly, terms such as "in tension" or "in compression" are to be understood to refer to the state of components when the showerhead is in normal use.

It is also to be understood that when reference is made herein to "thermally conductive" paths, such reference refers to thermally conductive paths provided by physical structural features rather than to thermal conductance through, for example, the gaseous environments that may be present within a showerhead.

FIG. 1A depicts a conceptual cross-sectional schematic of an example of a multi-plenum, dual-temperature showerhead. The showerhead 100 may include multiple plenum volumes, including a first plenum volume 102 and a second plenum volume 104. A plenum divider 108 may be positioned between the first plenum volume 102 and the second plenum volume 104 such that a first side 112 of the plenum divider 108 at least partially bounds the first plenum volume 102 and a second side 114 of the plenum divider 108 at least partially bounds the second plenum volume 104.

The first plenum volume 102 may be further bounded by a backplate 182 or other structure, e.g., a plasma dome, designed to contain process gases within the first plenum volume 102. The backplate may have one or more first gas inlets 144 that are configured to deliver a first process gas into the first plenum volume 102.

The second plenum volume 104 may be further bounded by a faceplate 110 with a first side 116 and a second side 118. The first side 116 of the faceplate 110 may be offset from the second side 114 of the plenum divider 108 by a first distance 120 that defines a first gap 128. The second plenum volume 104 may be further bounded by a first low-thermal conductance barrier 154, e.g., a ring-shaped, thin, metal seal. The first low-thermal conductance barrier 154 may be compressed between the first side 116 of the faceplate and the second side 114 of the plenum divider 108 so as to form a seal. The seal provided by the first low-thermal conductance barrier 154, as well as any similar barriers, may be capable of sealing against a pressure differential between ambient atmospheric conditions and vacuum conditions, although due to the substantially lower pressures used in semiconductor processing environments, the first low-thermal conductance barrier 154 may also be selected to provide a lesser degree of sealing, e.g., not capable of sealing against a pressure differential between ambient atmospheric conditions and vacuum, but capable of substantially sealing the second plenum volume 104 against pressure differentials experienced during lower-pressure wafer processing operations, i.e., low pressure differentials.

It is to be understood that the first low-thermal conductance barrier, as well as other potential low-thermal conductance barriers used in the examples provided herein, may be provided using any of a variety of structures that are substantially impermeable to gas flow (so as to prevent or inhibit gas flow from the first plenum volume or other plenum volumes through the low-thermal conductance barrier) and that have a low thermal conductance. In the pictured examples, the low-thermal conductance barrier presents a heat flow path (in a radial cross-section) that has a high length to width (and thus cross-sectional area) ratio, which results in a greatly reduced thermal conductance as compared with other potential barriers, e.g., O-rings or solid structural elements that usually define gas plenums.

The low-thermal conductance barrier may be made from a low-thermal conductivity material appropriate for the environmental conditions (temperature, chemical environment, etc.) of the showerhead, e.g., stainless steel or high-Ni content steel alloys like Inconel that can withstand semiconductor processing environments and that also offer lower thermal conductivity compared to Al alloys. Another possible material from which low-thermal conductance barriers may be made is tungsten.

While the low-thermal conductance barriers may take the form of an annular seal, there are many cross-sectional geometries of the low-thermal conductance barriers that may be used. For example, the seals shown have cross-section shapes that may generally be described as "M" or "W" seals, although "S"-shaped, "C"-shaped, "N" or "Z"-shaped, or "V"-shaped cross-sectional shapes, as well as cross-sectional shapes not corresponding to any particular alphabet letter, may also be used. Generally speaking, the low-thermal conductance barriers may have a cross section that follows a serpentine path and that does not contact itself. Such low-thermal conductance barriers may thus span a gap that is significantly smaller than the serpentine length of the low-thermal conductance barrier cross-section. Accordingly, the thermal resistance of the low-thermal conductance barrier across the gap is significantly higher than the resistance would be if the low-thermal conductance barrier was as short as possible, i.e., just long enough to bridge the gap between the faceplate and the plenum divider.

In some implementations, the serpentine length of a low-thermal conductance barrier may be on the order of 0.5 to 1.5" and the thickness of the low-thermal conductance barrier material may be on the order of 0.003 to 0.009 inches. Additionally, in some implementations, the low-thermal conductance barrier may only contact about 1% or less of the total surface area of the faceplate.

The second plenum volume 104 may be fluidly connected with a second gas inlet 146. In the depicted example, the first gas inlet 144 and the second gas inlet 146 are arranged in a coaxial fashion, with the second gas inlet 146 in the center and passing through the plenum divider 108 and protruding into the second plenum volume 104. A circular array of radial gas distribution holes 150 may be spaced about the outer perimeter of the portion of the second gas inlet 146 that protrudes into the second plenum volume 104 to allow gas flowing through the second gas inlet 146 to flow into the second plenum volume 104 in a substantially radially-symmetric fashion. The second gas inlet 146 may terminate at the faceplate 110 or may, as shown, be capped off prior to reaching the faceplate 110 (and may thus not contact the faceplate 110).

Gas flowing into the first process gas inlet 144 may flow through the annular space between the first gas inlet 144 and the second gas inlet 146 and then into the first plenum volume 102. Other gas inlet configurations may be used in place of the coaxial arrangement shown. For example, while the coaxial arrangement shown may be suitable for center-to-edge fed plenums, other showerhead geometries may utilize edge-to-center fed plenums, in which case one or more of the gas inlets may be located near the outer perimeter of the showerhead.

The faceplate 110 may be substantially thermally isolated from the other components of the showerhead 100. For example, the faceplate 110 may have minimized part-to-part contact with other components to reduce or minimize conductive heat transfer between the faceplate and the remainder of the showerhead 100. In the ideal case, the faceplate 110 would float in space relative to the other components in the showerhead 100. Practical considerations, however, require that there be some contact of the faceplate 110 with other components of the showerhead 100. For example, the faceplate 110 must be physically supported in space and some sort of structure may be needed to partially define the second plenum volume 104 within the first gap 128. In some implementations, the faceplate may also include one or more electrodes or other devices requiring an electrical current supply. In such implementations, it may be desirable or necessary to provide one or more conductive electrical contacts between the faceplate 110 and other components of the showerhead 100. Any such connections between the faceplate 110 and the remainder of the showerhead 100 may serve as thermally conductive paths between the faceplate 110 and the remainder of the showerhead 100.

Generally speaking, the aggregate thermal conductance of the structures connecting the faceplate 110 with the remainder of the showerhead 100, e.g., low-thermal conductance barriers and low-contact area (LCA) features, may be constrained to a value of approximately 0.05 $W/(in^2 K)$, as compared to the thermal conductance of an O-ring seal or metal-to-metal contact seen in many conventional faceplates, which may be on the order of 1 $W/(in^2 K)$. There may be many ways of implementing a showerhead that may comply with this constraint. The pictured designs represent merely one approach, although it is to be understood that other approaches are also within the scope of this disclosure.

In FIG. 1A, the faceplate 110 is supported by a plurality of LCA features 152. In the depicted example, the LCA features 152 are provided through the use of LCA balls, which are spherical balls 168 that are interposed in between the faceplate 110 and a collar 170 that is connected with the plenum divider 108. The spherical balls 168 may be nestled in grooves or recesses on the faceplate 110 and the collar 170 to substantially prevent the faceplate 110 from sliding radially with respect to the collar 170. The spherical balls 168 may be placed in compression through the weight of the faceplate 110, as well as any potential spring force provided by the first low-thermal conductance barrier 154 or other components that may be compressed between the faceplate 110 and the plenum divider 108 when the collar 170 is attached to the showerhead 100. The compressive loads on the spherical balls 168 may be transmitted into the spherical balls as, in effect, point or edge loads where the spherical balls 168 contact the faceplate 110 or the remainder of the showerhead 100. These compressive load paths may also serve as thermally conductive paths, although the thermal conductance of such paths may be extremely small due to the very small cross-sectional area of such paths at the contact patches. The LCA features 152 may act to space the faceplate 110 off from a collar surface of the collar 170 by a fourth distance 126.

Non-spherical balls may also be used, if desired, although such LCA features 152 may prove more difficult to use since the contact areas may depend on the orientation of the balls with respect to the faceplate 110 and the remaining components of the showerhead 100. Of course, other LCA features 152 may be used besides LCA balls, e.g., small-cross section posts, edge contacts, etc. Such features may be machined into the collar 170.

The above-discussed structures provide a first plenum volume 102 and a second plenum volume 104 as well as gas inlets to both plenum volumes. Discussion will now turn towards structures and features that facilitate gas distribution from each plenum volume to a wafer reaction area, i.e., underneath the showerhead 100.

The plenum divider 108 may include a plurality of tubular structures 132 that protrude from the second side 114 of the plenum divider 108. The tubular structures 132 may be contiguous with the overall plenum divider 108 structure, e.g., the plenum divider 108 and the tubular structures 132 may all be machined out of a common billet of material or produced from a single cast or molded part, or may be discrete structures, e.g., tubes that are brazed, diffusion bonded, glued, pressed into, or otherwise attached to the plenum divider 108. The tubular structures 132 may each have an exterior surface 134 and a first through-hole 136. The tubular structures 132 may protrude from the second side 114 of the plenum divider 108 by a second distance 122. The second distance 122 is longer than the first distance 120.

The faceplate 110, in turn, may have a plurality of second through-holes 138. The second through-holes 138 may be sized larger than the tubular structures 132. For example, there may be an offset, either constant or variable, of at least a third distance 124 between the exterior surfaces 134 of the tubular structures 132 and interior surfaces 142 of the second through-holes 138. This offset may produce, in the case of round tubular structures 132 and round second through-holes 138, an annular gap 130 between the tubular structures 132 and the second through-holes 138. In implementations with a variable third distance 124, the third distance 124 may vary with respect to each tubular structure 132 and second through-hole 138. For example, normal manufacturing tolerances may result in a tubular structure experiencing some relative mismatch in positioning with respect to the second through-hole 138. Alternatively, or additionally, the nominal offset between the tubular structures 132 and the second through-holes 138 may be engineered to vary depending on the position of the tubular structure 132. For example, the showerhead 100 may be designed such that the third distance 124 may be larger for tubular structures near the periphery of the faceplate 110 than the third distance 124 is near the center of the faceplate 110. This may allow the flow rate delivered through each second through-hole 138 to be tuned as a function of radial position.

In some implementations, the second distance 122 is not only longer than the first distance 120, but is also sufficiently long enough that each tubular structure 132 terminates at a location substantially even with the second side 118 of the faceplate 110 proximate to the corresponding second through-hole 138. In some other implementations, however, the tubular structures 132 may terminate at a location within the second through-hole 138, or may terminate at a location past the second side 118 of the faceplate 110.

Figure 1B:
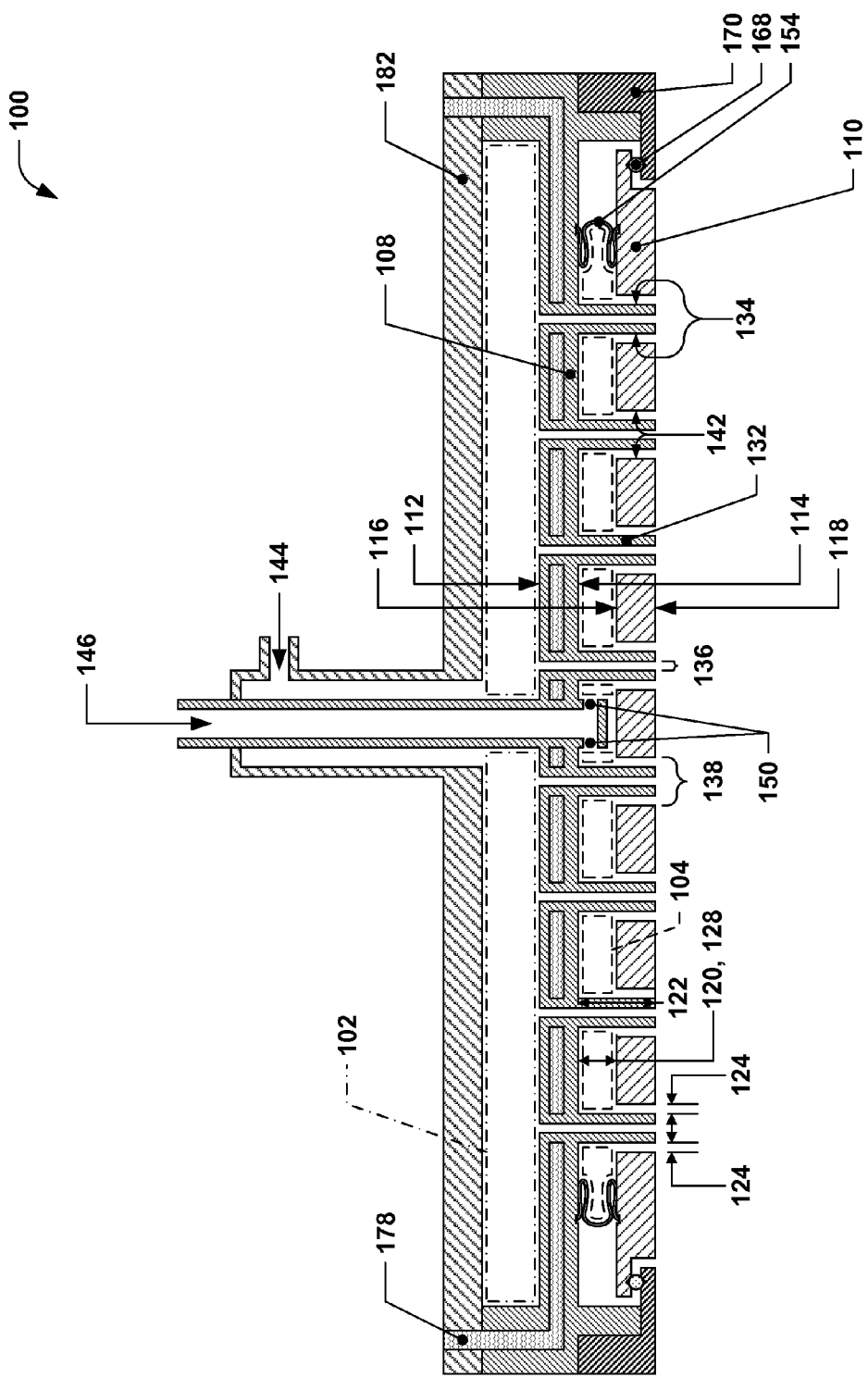
FIG. 1B depicts a conceptual cross-sectional schematic of an example of the multi-plenum, dual-temperature showerhead of FIG. 1A equipped with one or more cooling passages.

FIG. 1B depicts a conceptual cross-sectional schematic of an example of the multi-plenum, dual-temperature showerhead of FIG. 1A equipped with one or more cooling passages. It is to be understood that while these passages are termed "cooling" passages herein, such reference is also intended to embrace implementations where such passages may be used for heating or, more generally temperature control. Thus, fluids can be routed through the cooling passages to either increase or decrease the showerhead temperature. As can be seen, the first plenum 102 may be cooled through the use of cooling passage 178 that may allow coolant to be circulated through the plenum divider 108. An alternate implementation may provide a cooling passage that allows coolant to be circulated through the backplate 182 (not shown) in addition to, or alternatively to, coolant circulated within the plenum divider 108. Such configurations may allow the second plenum volume to be actively cooled during semiconductor processing operations. At the same time, due to the reduced thermally-conductive paths between the faceplate 110 and the remainder of the showerhead 100, the faceplate 110 may be relatively unaffected by the cooling provided by such cooling passages. This allows the faceplate 110 to be maintained at a potentially much hotter temperature than the remainder of the showerhead 100, thus allowing the gas in the second plenum volume 104 to be maintained at a potentially much hotter temperature than the gas in the first plenum volume 102 is maintained at. Additionally, the second side 118 of the faceplate 110 may be maintained at a much higher temperature than other surfaces in the reaction area, thus providing better quality deposition on the wafer.

Figure 2:
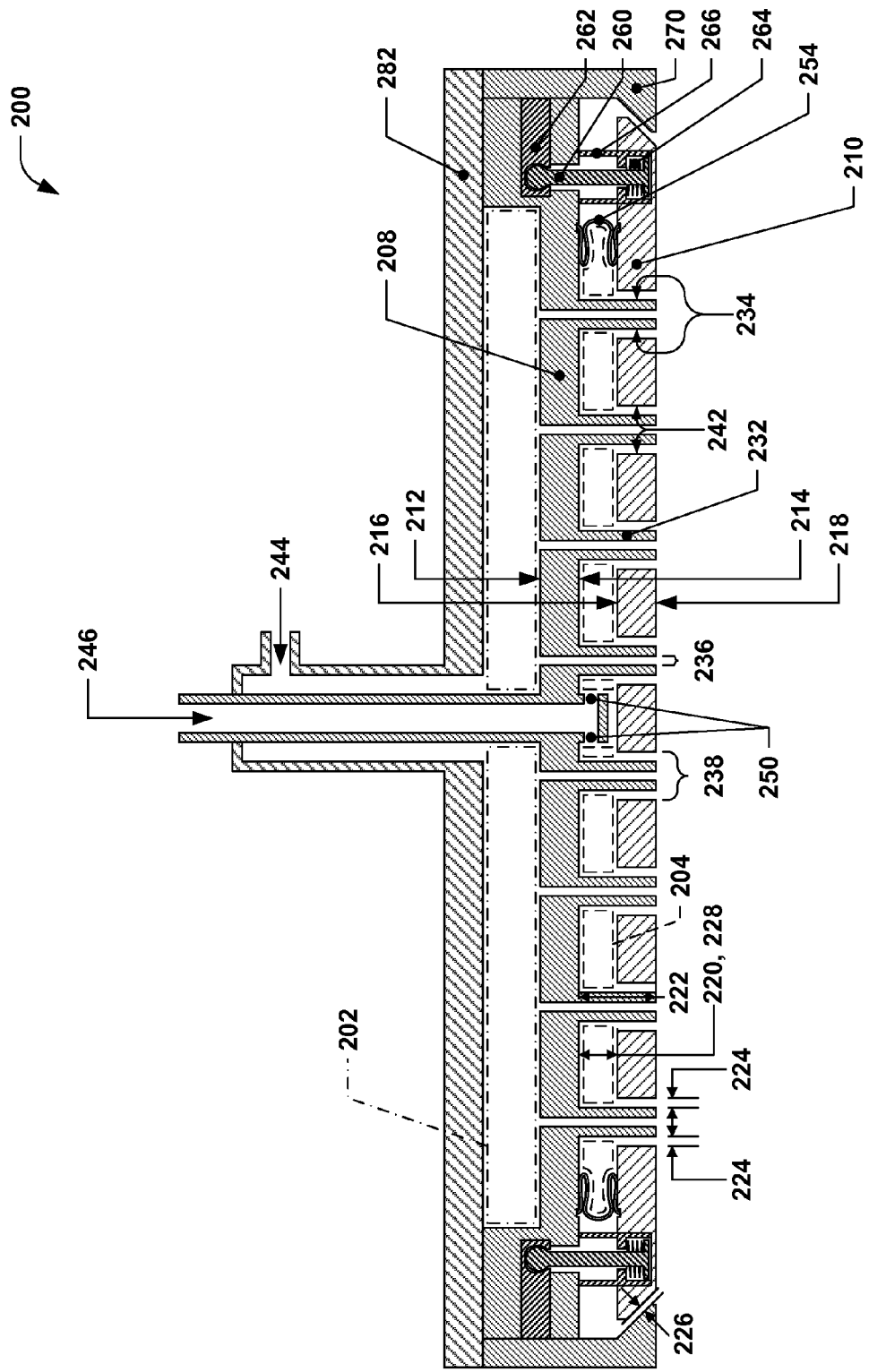
FIG. 2 depicts a conceptual cross-sectional schematic of another example of a multi-plenum, dual-temperature showerhead.

FIG. 2 depicts a conceptual cross-sectional schematic of another example of a multi-plenum, dual-temperature showerhead. In FIG. 2, the overall structure of the showerhead 200 is similar to the overall structure of the showerhead 100 of FIGS. 1A and 1B. It is to be understood that, with the exception of specific structures, elements, and features of FIG. 2 that are discussed below, structures, elements, or features of FIG. 2 that are enumerated with callouts having the same last two digits as structures, elements, or features of FIGS. 1A and 1B may be substantially identical to those corresponding structures, elements, or features of FIGS. 1A and 1B that are described above. In the interest of avoiding repetition, the reader is referred to the earlier discussion for description of such items. For example, FIG. 2 includes a first plenum volume 202, a second plenum volume 204, a first side 212 of the plenum divider 208, a second side 214 of the plenum divider 208, a first side 216 of the faceplate 210, a second side 218 of the faceplate 210, a first distance 220, a second distance 222, a third distance 224, tubular structures 232, exterior surfaces 234 of the tubular structures 232, first through-holes 236, second through-holes 238, interior surfaces 242 of the second through-holes 238, a first gas inlet 244, a second gas inlet 246, radial gas distribution holes 250, a first low-thermal conductance barrier 254, and a backplate 282 that respectively correspond with, and are similar to, the first plenum volume 102, the second plenum volume 104, the first side 112 of the plenum divider 108, the second side 114 of the plenum divider 108, the first side 116 of the faceplate 110, the second side 118 of the faceplate 110, the first distance 120, the second distance 122, the third distance 124, the tubular structures 132, the exterior surfaces 134 of the tubular structures 132, the first through-holes 136, the second through-holes 138, the interior surfaces 142 of the second through-holes 138, the first gas inlet 144, the second gas inlet 146, the radial gas distribution holes 150, the first low-thermal conductance barrier 154, and the backplate 182 of FIGS. 1A and 1B.

One difference between the showerhead 200 and the showerhead 100 is that the faceplate 210 of the showerhead 200 is supported using tensile supports rather than compressive supports. As shown in FIG. 2, a radial array of rotatable camlocks 262, i.e., cylinders having a receptacle configured to engage with a post 260 via a camming feature, may be located about the periphery of the plenum divider 208 (or other portion of the showerhead 200). The posts 260 may be connected with the faceplate 210, e.g., via a standoff 266 and spring 264. The spring 264 may be a coil spring, or may be provided via some other mechanism, e.g., a stack of Belleville washers placed in alternating directions around each post 260. The standoff 266 may be embedded within, or otherwise connected to, the faceplate 210. The standoff 266 may have features, e.g., an internal ledge or shoulder, that may act to compress the spring 264 when the post 260 is pulled away from the faceplate 210. The standoff 266 may also protrude from the faceplate 210. When the post 260 is engaged with its corresponding camlock 262 and the corresponding camlock 262 is rotated, the camlock 262 may attempt to draw the post 260 and, initially, the faceplate 110 towards the plenum divider 208. When the post 260 and the faceplate 110 are eventually drawn towards the plenum divider by a sufficient distance, the standoffs 266 may contact the plenum divider 208 (or other structure) and the remaining movement of the post 260 may be primarily accommodated by compression of the spring 264. Thus, the posts 260 may be placed in tension.

It is to be understood that any support of the faceplate with respect to the remainder of the showerhead will involve some combination of tensile and compressive stresses. If reference is made to such support being "in tension," it is to be understood that such support involves a structural configuration where the average maximum stresses attributable to faceplate support are tensile in nature, e.g., such as in the camlock/post arrangement of FIG. 2. Conversely, if reference is made to such support being "in compression," it is to be understood that such support involves a structural configuration where the average maximum stresses attributable to faceplate support are compressive in nature, e.g., such as in the spherical ball arrangement of FIGS. 1A and 1B.

As can be seen, the collar 270 differs slightly from the collar 170 in that it does not feature a stepped shoulder in the vicinity of the faceplate 210, but instead has a tapered shoulder that necks down to an internal diameter smaller than the faceplate 210 diameter. In other implementations, the collar 270 may not exist at all, or may have an internal diameter that is larger than the external diameter of the faceplate 210. If a collar 270, or a collar of a different design, is used, it may be offset from the faceplate 210 by at least the fourth distance 226. This gap may serve as a thermal break and prevent direct thermally conductive contact between the faceplate 210 and the collar 270.

Figure 3A:
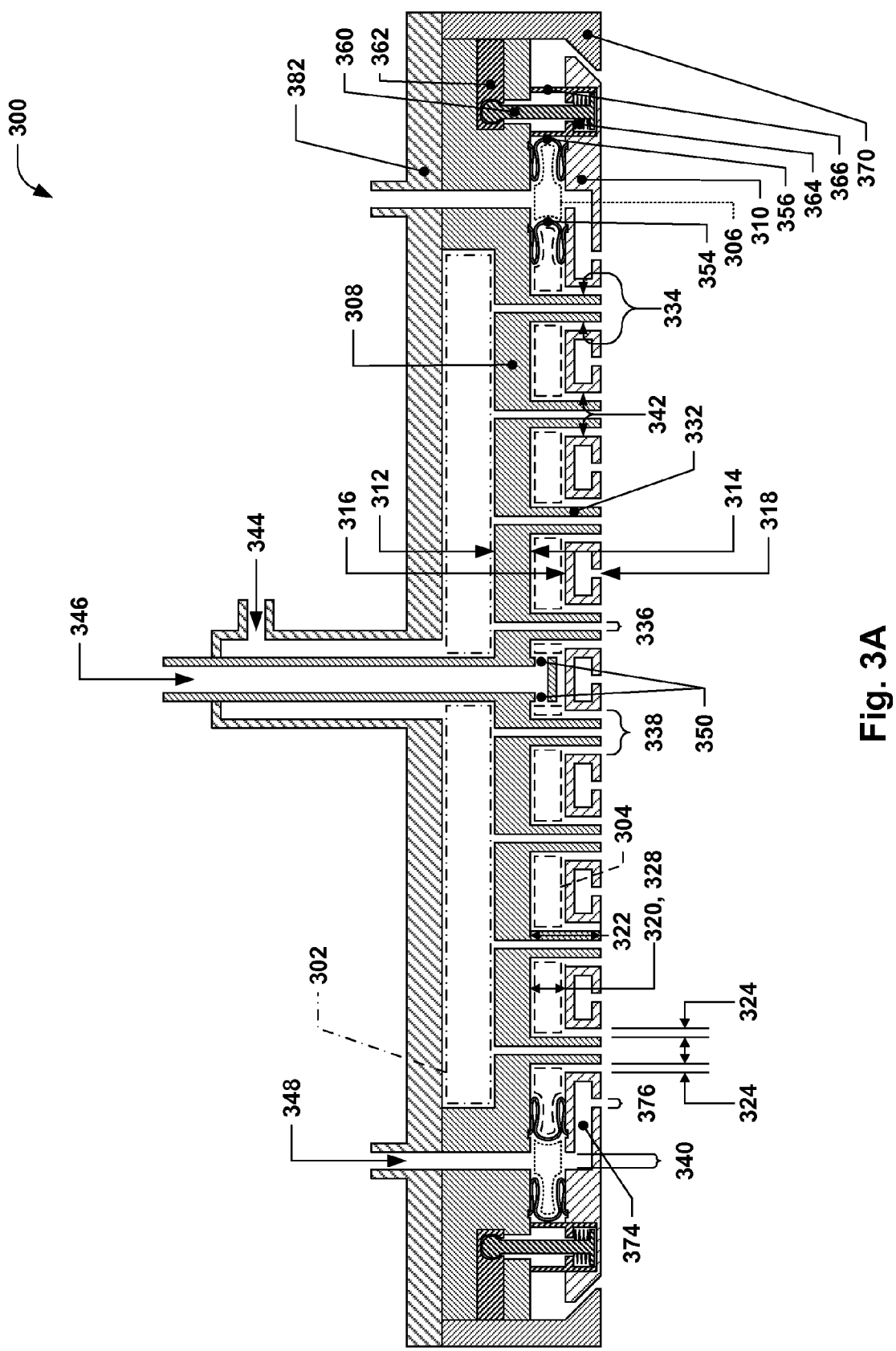
FIG. 3A depicts a conceptual cross-sectional schematic of an example of a multi-plenum, dual-temperature showerhead with three plenums.
Figure 3B:
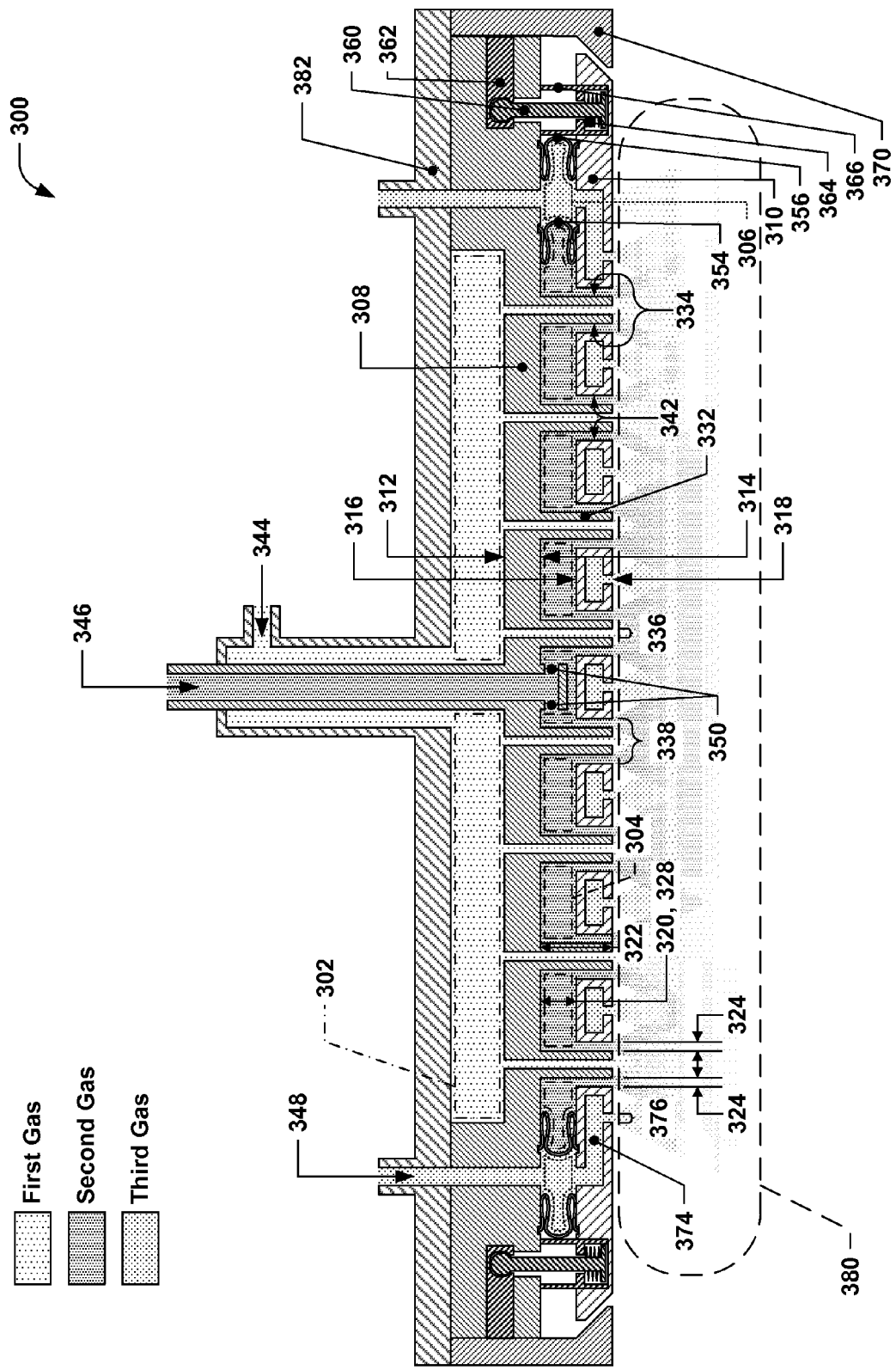
FIG. 3B depicts a conceptual cross-sectional schematic of the example multi-plenum, dual-temperature showerhead of FIG. 3A with gas flows depicted.

FIG. 3A depicts a conceptual cross-sectional schematic of an example of a multi-plenum, dual-temperature showerhead with three plenums. FIG. 3B depicts a conceptual cross-sectional schematic of the example multi-plenum, dual-temperature showerhead of FIG. 3A with gas flows depicted. In FIGS. 1A, 1B, and 2, the showerheads shown are dual-plenum showerheads configured to deliver two different process gases to a wafer reaction area without pre-delivery mixing between the gases within the showerheads. The dual-temperature showerhead concepts described herein, however, may be applied to showerheads having more than two plenums. FIGS. 3A and 3B depict an example of one such showerhead.

In FIGS. 3A and 3B, the overall structure of the showerhead 300 is similar to the overall structure of the showerhead 200 of FIG. 2. It is to be understood that, with the exception of specific structures, elements, and features of FIGS. 3A and 3B that are discussed below, structures, elements, or features of FIGS. 3A and 3B that are enumerated with callouts having the same last two digits as structures, elements, or features of FIG. 2 may be substantially identical to those corresponding structures, elements, or features of FIG. 2 that are described above. In the interest of avoiding repetition, the reader is referred to the earlier discussion for description of such items. For example, FIGS. 3A and 3B include a first side 312 of the plenum divider 308, a second side 314 of the plenum divider 308, a first side 316 of the faceplate 310, a second side 318 of the faceplate 310, a first distance 320, a second distance 322, a third distance 324, tubular structures 332, exterior surfaces 334 of the tubular structures 332, first through-holes 336, interior surfaces 342 of second through-holes 338, radial gas distribution holes 350, posts 360, camlocks 362, springs 364, standoffs 366, a collar 370, and a backplate 382 that respectively correspond with, and are similar to, the first side 212 of the plenum divider 208, the second side 214 of the plenum divider 208, the first side 216 of the faceplate 210, the second side 218 of the faceplate 210, the first distance 220, the second distance 222, the third distance 224, the tubular structures 232, the exterior surfaces 234 of the tubular structures 232, the first through-holes 236, the interior surfaces 242 of the second through-holes 238, the radial gas distribution holes 250, the posts 260, the camlocks 262, the springs 264, the standoffs 266, the collar 270, and the backplate 282 of FIG. 2.

In addition to the first plenum volume 302 and the second plenum volume 304, the showerhead 300 also includes a third plenum volume 306 that is located between the first low-thermal conductance barrier 354 and a second low-thermal conductance barrier 356 and that is also located between the plenum divider 308 and the faceplate 310. The pictured second low-thermal conductance barrier 356 has a larger diameter than the first low-thermal conductance barrier 354 in this example.

A third gas inlet or inlets 348 may be configured to provide gas to the third plenum volume 306. A plurality of third holes 340 may place the third plenum volume 306 in fluidic communication with internal flow passages 374 within the faceplate 310. The internal flow passages 374 may, as in this example, be fluidly isolated within the faceplate 310 from the second through-holes 338. In this example, the internal flow passages 374 may be fluidly connected with fourth holes 376, which may allow a third process gas delivered to the internal flow passages 374 to be delivered to a wafer reaction area beneath the showerhead 300.

In the pictured example, the third gas inlet 348 is located near the perimeter of the faceplate 310 and may thus be referred to as "edge-fed gas delivery." It is to be understood that, in other implementations, the third gas inlet 348 may be provided by an additional coaxial gas inlet near the center of the showerhead 300, e.g., as part of the coaxial gas inlet arrangement providing the first gas inlet 344 and the second gas inlet 346. In such implementations, referred to as "center fed gas delivery," the second low-thermal conductance barrier 356 may be located near the center of the faceplate 310 and the plenum divider 308 (and be considerably smaller in diameter than the first low-thermal conductance barrier 354). Generally speaking, various configurations of edge-fed/center-fed gas deliveries may be used for the various gases that may be used with the showerheads described herein consonant with the thermal isolation structures and strategies disclosed herein.

As can be seen in FIG. 3B, process gases flowed into the first gas inlet(s) 344, the second gas inlet(s) 346, and the third gas inlet(s) 348 may flow through the showerhead in substantially segregated flows until the gases are released into a wafer reaction area 380. This may substantially prevent the process gases from mixing within the showerhead prior to delivery to the wafer reaction area 380. Such segregated flow approaches may prevent premature reaction of the process gases within the showerhead (which may cause unwanted deposition or other side effects). Additionally, the segregated flow approaches may allow at least two of the process gases to be kept at dramatically different temperatures up until the gases are delivered to the wafer reaction area 380.

Figure 4:
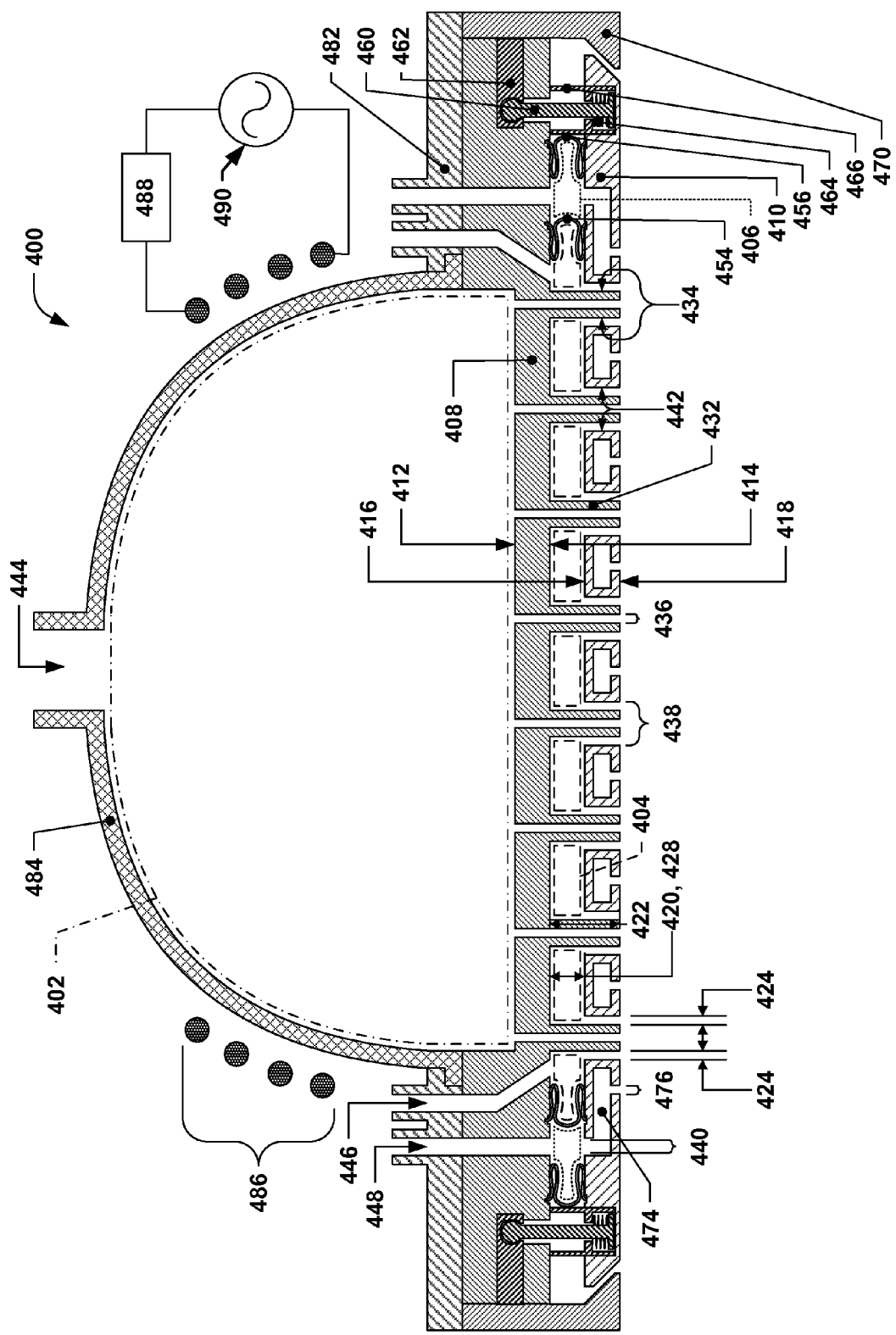
FIG. 4 depicts a conceptual cross-sectional schematic of an example of a multi-plenum, dual-temperature showerhead interfaced with a plasma dome.

FIG. 4 depicts a conceptual cross-sectional schematic of an example of a multi-plenum, dual-temperature showerhead interfaced with a plasma dome. In FIG. 4, the overall structure of the showerhead 300 is similar to the overall structure of the showerhead 300 of FIGS. 3A and 3B. It is to be understood that, with the exception of specific structures, elements, and features of FIG. 4 that are discussed below, structures, elements, or features of FIG. 4 that are enumerated with callouts having the same last two digits as structures, elements, or features of FIGS. 3A and 3B may be substantially identical to those corresponding structures, elements, or features of FIGS. 3A and 3B that are described above. In the interest of avoiding repetition, the reader is referred to the earlier discussion for description of such items. For example, FIG. 4 includes a first plenum volume 402, a second plenum volume 406, a first side 412 of the plenum divider 408, a second side 414 of the plenum divider 408, a first side 416 of the faceplate 410, a second side 418 of the faceplate 410, a first distance 420, a second distance 422, a third distance 424, tubular structures 432, exterior surfaces 434 of the tubular structures 432, first through-holes 436, second through-holes 438, third holes 440, interior surfaces 442 of the second through-holes 438, third gas inlets 448, a first low-thermal conductance barrier 454, a second low-thermal conductance barrier 456, posts 460, camlocks 462, springs 464, standoffs 466, a collar 470, internal flow passages 474, and fourth holes 476 that respectively correspond with, and are similar to, the first plenum volume 302, the second plenum volume 306, the first side 312 of the plenum divider 308, the second side 314 of the plenum divider 308, the first side 316 of the faceplate 310, the second side 318 of the faceplate 310, the first distance 320, the second distance 322, the third distance 324, the tubular structures 332, the exterior surfaces 334 of the tubular structures 332, the first through-holes 336, the second through-holes 338, the third holes 340, the interior surfaces 342 of the second through-holes 338, the third gas inlets 348, the first low-thermal conductance barrier 354, the second low-thermal conductance barrier 356, the posts 360, the camlocks 362, the springs 364, the standoffs 366, the collar 370, the internal flow passages 374, and the fourth holes 376 of FIGS. 3A and 3B.

The previously-discussed example showerheads have been equipped with backplates. In some implementations, e.g., showerheads intended for use in semiconductor processes where remote plasma generation may be desired, the first plenum volume may instead be substantially defined by the plenum divider and by a plasma dome. For example, in FIG. 4, the showerhead 400 may include a backplate 482 that connects a plasma dome 484 with the plenum divider 408 (the plasma dome 484 may also be directly connected with the plenum divider 408, or connected with other components not shown). The plasma dome 484 may have a first gas inlet 444, e.g., located near the top center of the plasma dome 484. Electrodes 486 may be positioned around the plasma dome 484 and coupled to a radio-frequency (RF) generator 490 via a matching network 488. The RF generator 490 may, via the electrodes 486, be used to strike a plasma within the plasma dome 484 using gases supplied via the first process gas inlet 444.

Another difference between the previous showerhead examples and the example of FIG. 4 is that the second plenum volume 404 is provided gas via second gas inlets 446 that are spaced about the perimeter of the faceplate 410. This allows the plasma dome 484 to be free of internal structures, e.g., a center-fed second gas inlet that may interfere with plasma generation.

Additional examples of dual-temperature, multi-plenum showerheads are discussed below with respect to more detailed drawings showing various three-dimensional aspects of such implementations.

Figure 5C:
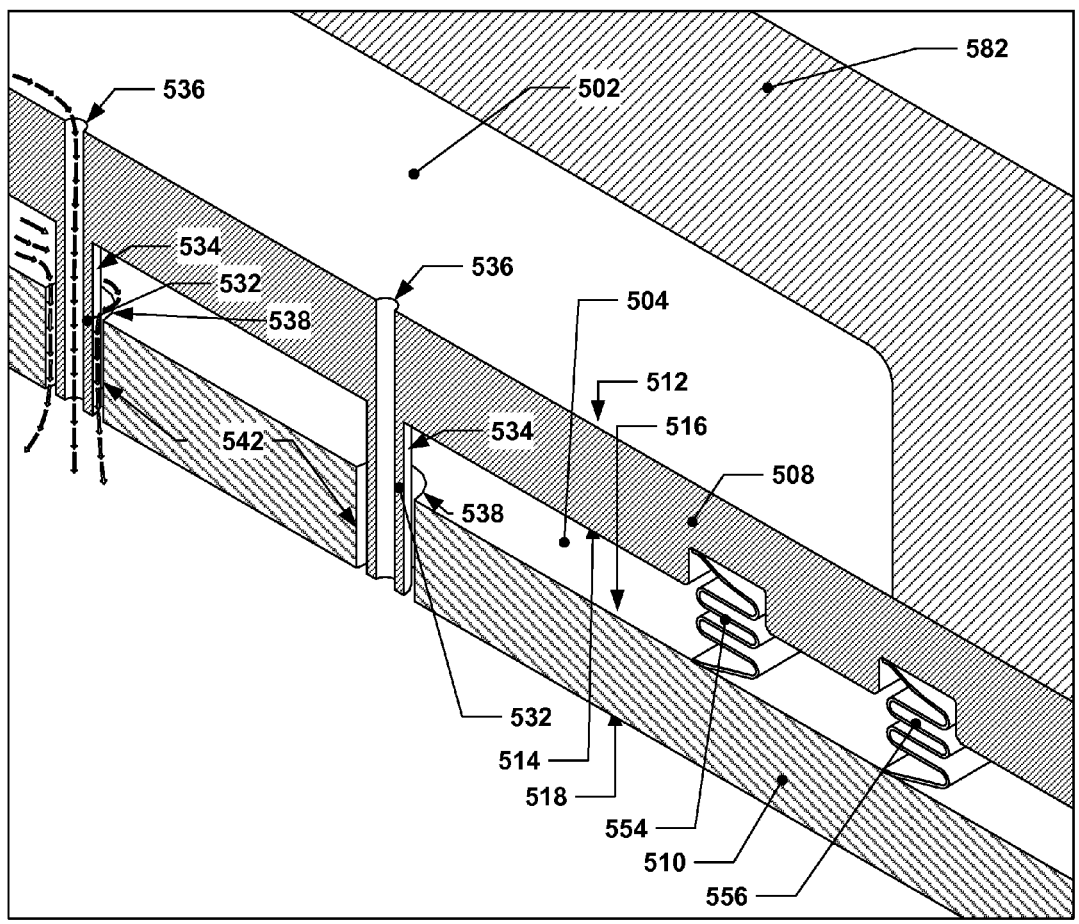
FIG. 5C depicts a detail view of the portion of FIG. 5A enclosed in a dashed rectangle.
Figures 5D, 5E:
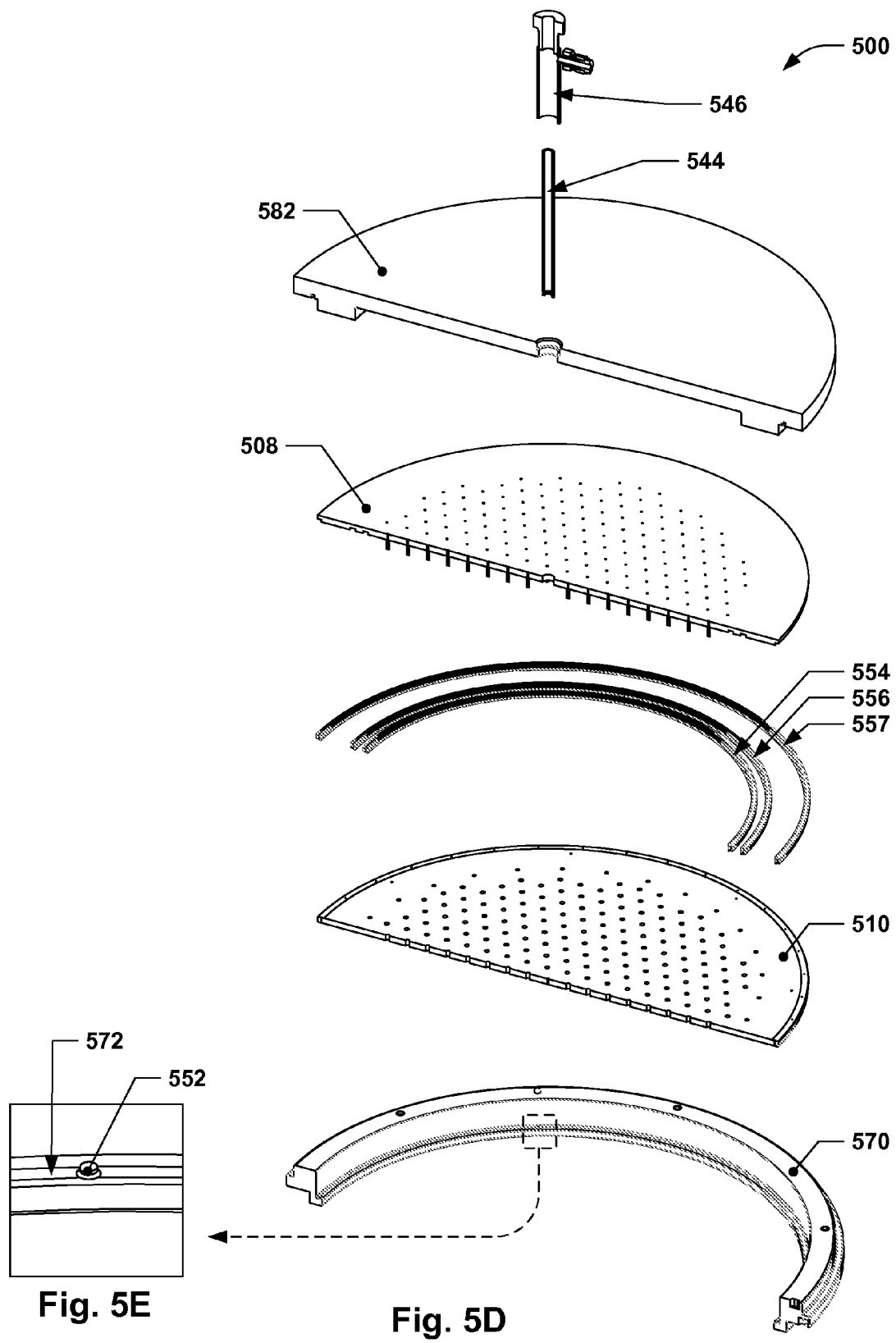
FIG. 5D depicts a trimetric exploded section view of the example of a dual-plenum, dual-temperature showerhead from FIG. 5A.
FIG. 5E shows a detail view of a portion of FIG. 5D.

FIG. 5A depicts an isometric view of one example of a dual-plenum, dual-temperature showerhead. FIG. 5B depicts an isometric section view of the example of a dual-plenum, dual-temperature showerhead from FIG. 5A. FIG. 5C depicts a detail view of the portion of FIG. 5A enclosed in a dashed rectangle. FIG. 5D depicts a trimetric exploded section view of the example of a dual-plenum, dual-temperature showerhead from FIG. 5A.

As can be seen, a showerhead 500 has a generally circular shape. While such axially-symmetric overall profiles are often preferred in the semiconductor fabrication context due to symmetry concerns, the showerhead 500 may have other shapes as well, e.g., portions of the showerhead 500 that do not affect process uniformity, e.g., portions that are external to the wafer reaction area, may be allowed to have other shapes, e.g. rectangular, square, etc.

A first plenum volume 502 and a second plenum volume 504 may be located within the showerhead 500, and may be separated from one another by a plenum divider 508. The first plenum volume 502 may be fed through a first gas inlet 544 and may be located between the plenum divider 508 and a backplate 582. The second plenum volume 504 may be fed via a second gas inlet 546 and may be located between the plenum divider 508 and a faceplate 510. The second gas inlet 546 may have a plurality of radial gas distribution holes 550 that cause gas to initially flow in a radial direction when delivered into the second plenum volume 504. The faceplate 510 may be supported by a collar 570 via LCA features 552, and a first low-thermal conductance barrier 554, a second low-thermal conductance barrier 556, and a third low-thermal conductance barrier 557 may be interposed between the faceplate 510 and the plenum divider 508. In showerhead 500, three low-thermal conductance barriers are used, although other implementations, e.g., similar to showerheads 100 or 300, may only use one or two low-thermal conductance barriers. In this example, the third low-thermal conductance barrier 557 acts as a flexible electrically conductive contact to convey electrical power to an electrode (not shown) within the faceplate 510. A plurality of first through-holes 536 may fluidly connect the first plenum volume 502 with a wafer reaction area (not explicitly shown) beneath the showerhead 500.

As can be seen further in the detail view of FIG. 5C, the first plenum volume 502 is partially bounded by a first side 512 of the plenum divider 508 and a backplate 582 and the second plenum volume 504 is partially bounded by a second side 514 of the plenum divider 508 and a first side 516 of the faceplate 510. As can further be seen, the second side 514 of the plenum divider 508 may have recessed annular channels configured to receive the low-thermal conductance barriers; this may help center the low-thermal conductance barriers in the assembly and prevent them from being displaced radially by any significant distance. Such channels are optional, however, and may also be provided, alternatively or additionally, in the first side 516 of the faceplate 510.

In the implementation shown, which is sized for use with 300 mm semiconductor wafers, the first low-thermal conductance barrier 554 has an approximate inner diameter of 12", and the gap between the bottoms of the recessed annular channels and the faceplate 510 is approximately 0.2". Due to the recurvate nature of the first low-thermal conductance barrier 554, the serpentine cross-sectional length of the first low-thermal conductance barrier 554 is approximately 1", i.e., about 5 times longer than the gap width that the first low-thermal conductance barrier 554 spans. Furthermore, in the implementation shown, the faceplate 510 has an overall surface area (not including hole sidewalls) of approximately 380 square inches, and is supported by six LCA features 552 that are each in contact with the faceplate 510 over an area of approximately 0.006 square inches. In addition to the approximately 0.036 square inches of LCA feature contact, the faceplate may also be in contact with the three low-thermal conductance barriers shown, each of which may be in contact with approximately 1 square inch or less of the faceplate 510. Thus, the faceplate 510 of this example, may only be in direct contact with other components over approximately 2 to 3 square inches of the faceplate 510's overall surface area of approximately 380 square inches, e.g., on the order of 1% or less of the faceplate 510's overall surface area. These dimensions, of course, are particular to the implementation shown and are only approximate. Variations on these dimensions are within the scope of this disclosure as well, providing that they produce the benefits discussed herein.

As can also be seen in FIG. 5C, the plenum divider 508 may have a plurality of tubular structures 532, each associated with a different first through-hole 536. Each tubular structure may protrude into (or through, in this case) second through-holes 538 located in the faceplate 510. As can be seen, an annular gap exists between the exterior surfaces 534 of the tubular structures 532 and the interior surfaces 542 of the second through-holes 538. In this example, the tubular structures 532 extend through the second through-holes 538 and are substantially even with a second side 518 of the faceplate 510.

To assist in visualizing gas flows within the showerhead, arrows indicating general directions of some gas flows have been added to FIG. 5C. For example, a first process gas delivered via the first plenum volume 502 is indicated with solid black arrows, and a second process gas delivered via the second plenum volume 504 is indicated with white arrows. As can be seen, the black arrows indicate flow through the first through-hole 536, whereas the white arrows indicate flow through the annular space between the exterior surface 534 and the interior surface 542.

FIG. 5D shows, as discussed above, a trimetric exploded section view of the showerhead 500. As can be seen, the construction of each component is relatively straightforward, and the assembly process may be relatively streamlined. Also visible in FIG. 5D is a detail view 5E that shows a portion of the collar 570. Specifically visible is a collar surface 572 with an LCA feature 552, e.g., a stud or other small protuberance, protruding from it.

Figure 6C:
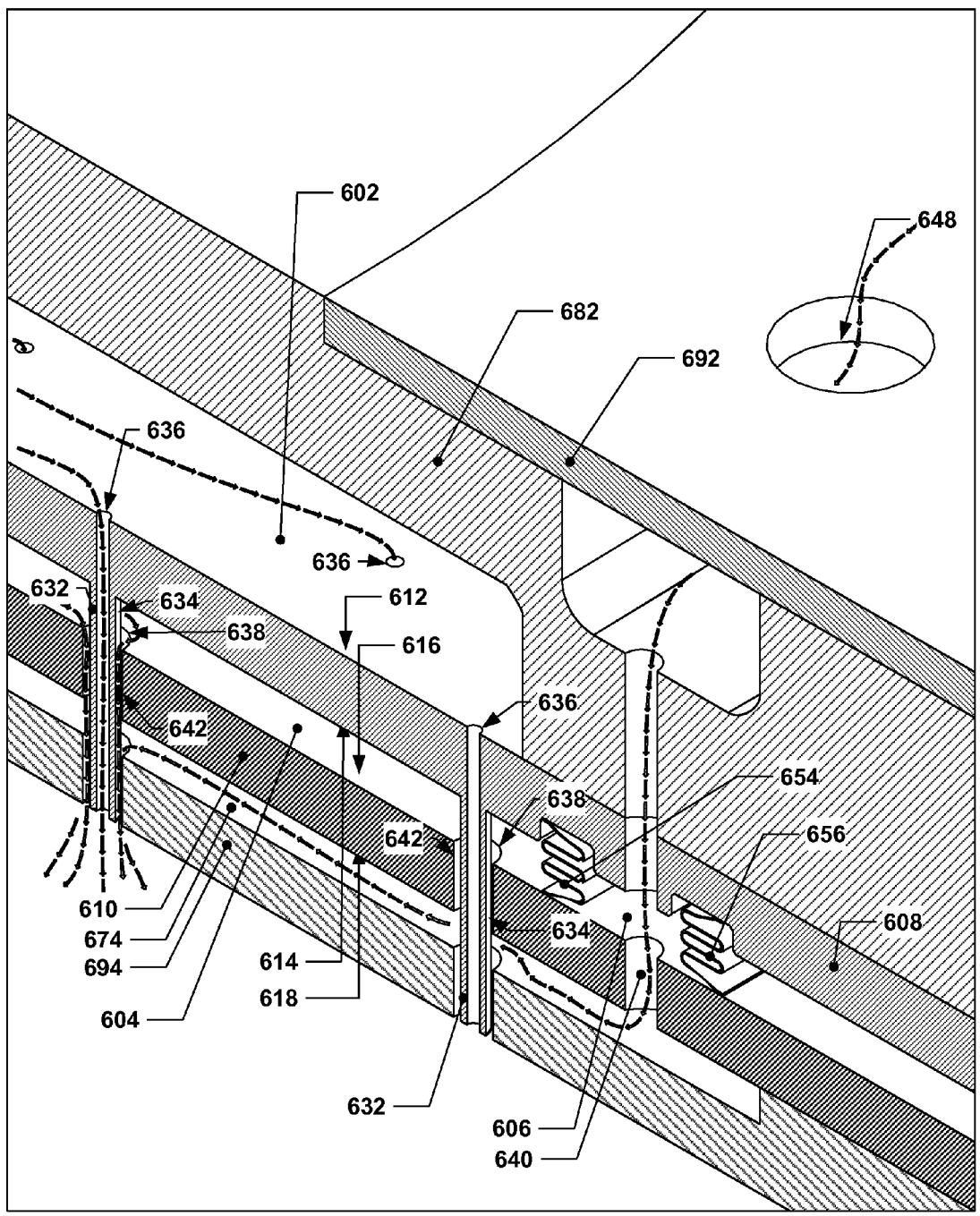
FIG. 6C depicts a detail view of the portion of FIG. 6A enclosed in a dashed rectangle.

Whereas the showerhead 500 of FIGS. 5A through 5E is a dual-plenum, dual-temperature showerhead, FIGS. 6A through 6D depict a tri-plenum, dual-temperature showerhead. FIG. 6A depicts an isometric view of one example of the tri-plenum, dual-temperature showerhead. FIG. 6B depicts an isometric section view of the example of a tri-plenum, dual-temperature showerhead from FIG. 6A.

Figure 6D:
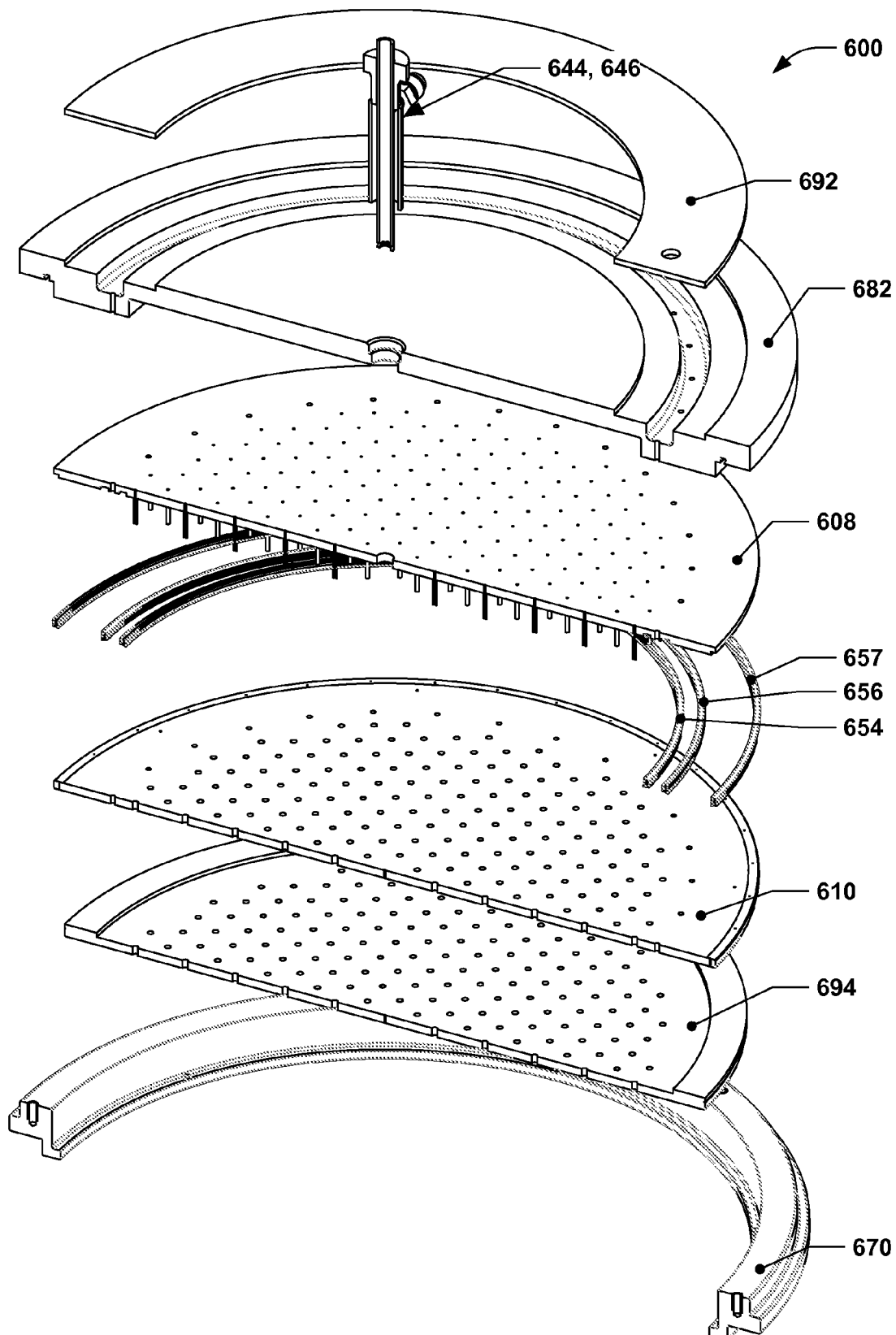
FIG. 6D depicts a trimetric exploded section view of the example of a tri-plenum, dual-temperature showerhead from FIG. 6A.

FIG. 6C depicts a detail view of the portion of FIG. 6A enclosed in a dashed rectangle. FIG. 6D depicts a trimetric exploded section view of the example of a tri-plenum, dual-temperature showerhead from FIG. 6A.

Similar to the showerhead 500, a first plenum volume 602 and a second plenum volume 604 may be located within a showerhead 600, and may be separated from one another by a plenum divider 608. The first plenum volume 602 may be fed through a first gas inlet 644 and may be located between the plenum divider 608 and a backplate 682. The second plenum volume 604 may be fed via a second gas inlet 646 and may be located between the plenum divider 608 and a faceplate 610. The second gas inlet 646 may have a plurality of radial gas distribution holes 650 that cause gas to initially flow in a radial direction when delivered into the second plenum volume 604. A third plenum volume 606, visible in FIG. 6C, may be supplied with gas via one or more third gas inlets 648. The third plenum volume may provide process gas to an internal flow passage or passages 674, visible in FIG. 6C, that are, for example, formed between the faceplate 610 and a faceplate cover 694.

The faceplate 610 may be supported by a collar 670 via LCA features 652, and a first low-thermal conductance barrier 654, a second low-thermal conductance barrier 656, and a third low-thermal conductance barrier 657 may be interposed between the faceplate 610 and the plenum divider 608. In showerhead 600, three low-thermal conductance barriers are used, although the third low-thermal conductance barrier 657 may be optional. The third plenum volume 606 may, for example, be located between the first low-thermal conductance barrier 654 and the second low-thermal conductance barrier 656. A plurality of first through-holes 636 may fluidly connect the first plenum volume 602 with a wafer reaction area (not explicitly shown) beneath the showerhead 600.

As can be seen further in the detail view of FIG. 6C, the first plenum volume 602 is partially bounded by a first side 612 of the plenum divider 608 and a backplate 682 and the second plenum volume 604 is partially bounded by a second side 614 of the plenum divider 608 and a first side 616 of the faceplate 610. As can further be seen, as with the showerhead 500, the second side 614 of the plenum divider 608 may have recessed annular channels configured to receive the low-thermal conductance barriers.

As is also visible in FIG. 6C, the third plenum volume 606 may be located between the first low-thermal conductance barrier 654 and the second low-thermal conductance barrier 656, as well as between the second side 614 of the plenum divider 608 and the first side of the faceplate 610. The third plenum volume 606 may be fed gas from the third gas inlet(s) 648 via an annular space located beneath a ring plate 692 and various through-holes connecting the annular space with the third plenum 606. The exact routing and configuration of the fluid flow connection between the third gas inlet 648 and the third plenum volume 606 may vary from that shown. A plurality of third holes 640 may fluidly connect the third plenum volume 606 with the internal flow passage(s) 674.

As with the plenum divider 508, the plenum divider 608 may have a plurality of tubular structures 632, each associated with a different first through-hole 636. Each tubular structure may protrude into (or through, in this case) second through-holes 638 located in the faceplate 610. In this case, the second through holes 638 may also pass through the faceplate cover 694, which may be considered to be a subcomponent of the faceplate 610. In this particular example, a large, contiguous open volume is formed between a second side 618 of the faceplate 610 and the faceplate cover 694. This open volume forms the internal flow passage 674, and is perforated by the tubular structures 632. As shown, the internal flow passage 674 may, in this example, be in fluidic communication with the second plenum volume 604 as well as with the wafer reaction area (not shown, but located below the showerhead 600) via the second through-holes 638. In this case, the gases introduced into the second plenum volume 604 and into the internal flow passage(s) will mix (assuming they are flowed simultaneously) within the showerhead. Accordingly, it may be desirous to utilize such a design when the gases that will be routed through the second plenum volume 604 and the internal flow passage(s) 674 do not produce undesirable reaction byproducts when mixed within the showerhead 600. It may also be desirable to maintain a higher pressure within the second plenum volume 604 than within the internal flow passages 674 to prevent back flow of gas from the internal flow passages 674 into the second plenum volume 604.

To assist in visualizing gas flows within the showerhead, arrows indicating general directions of some gas flows have been added to FIG. 6C. For example, a first process gas delivered via the first plenum volume 602 is indicated with solid black arrows, a second process gas delivered via the second plenum volume 604 is indicated with white arrows, and a third process gas delivered via the third plenum volume 606 is indicated with grey arrows. As can be seen, the black arrows indicate flow through the first through-hole 636, whereas the white arrows and the grey arrows indicate flow through the annular space between the exterior surface 634 and the interior surface 642.

FIG. 6D shows, as discussed above, a trimetric exploded section view of the showerhead 600. The annular space beneath the ring plate 692 that feeds the third plenum volume 606 is clearly visible in this view.

Figure 7C:
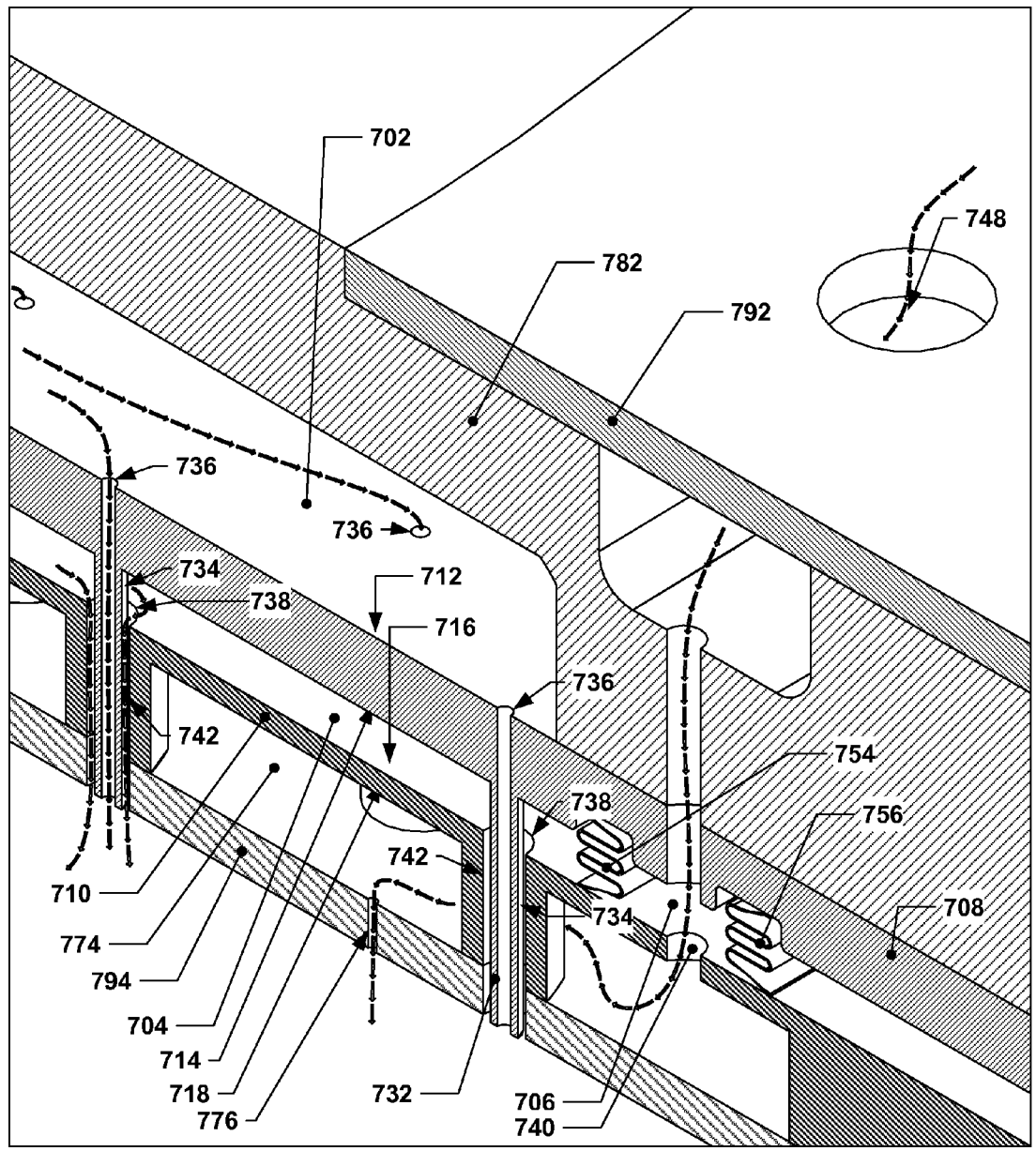
FIG. 7C depicts a detail view of the portion of FIG. 7B enclosed in a dashed rectangle.
Figure 7D:
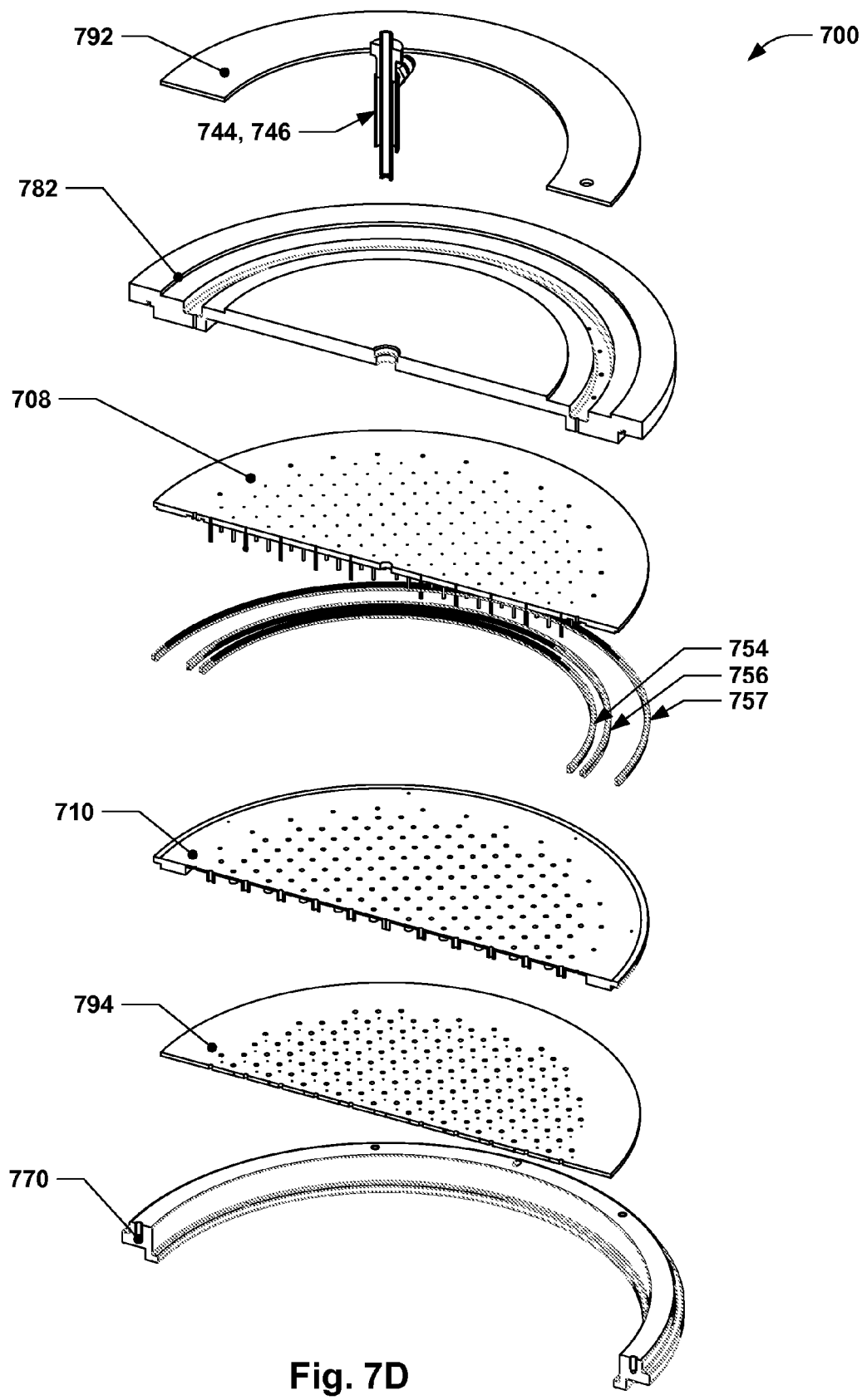
FIG. 7D depicts a trimetric exploded section view of the example of a tri-plenum, dual-temperature showerhead from FIG. 7A.

FIG. 7A depicts an isometric view of another example of a tri-plenum, dual-temperature showerhead. FIG. 7B depicts an isometric section view of the example of a tri-plenum, dual-temperature showerhead from FIG. 7A. FIG. 7C depicts a detail view of the portion of FIG. 7B enclosed in a dashed rectangle. FIG. 7D depicts a trimetric exploded section view of the example of a tri-plenum, dual-temperature showerhead from FIG. 7A.

In FIGS. 7A through 7D, the overall structure of the showerhead 700 is similar to the overall structure of the showerhead 600 of FIGS. 6A through 6D. It is to be understood that, with the exception of specific structures, elements, and features of FIGS. 7A through 7D that are discussed below, structures, elements, or features of FIGS. 7A through 7D that are enumerated with callouts having the same last two digits as structures, elements, or features of FIGS. 6A through 6D may be substantially identical to those corresponding structures, elements, or features of FIGS. 6A through 6D that are described above. In the interest of avoiding repetition, the reader is referred to the earlier discussion for description of such items. For example, FIGS. 7A through 7D include a plenum divider 708, a first side 712 of the plenum divider 708, a second side 714 of the plenum divider 708, a first side 716 of a faceplate 710, a second side 718 of the faceplate 710, tubular structures 732, third holes 740, a first gas inlet 744, a second gas inlet 746, a third gas inlet 748, radial gas distribution holes 750, a first low-thermal conductance barrier 754, a second low-thermal conductance barrier 756, a third low-thermal conductance barrier 757, a collar 770, a backplate 782, and a ring plate 792 that respectively correspond with, and are similar to, the plenum divider 608, the first side 612 of the plenum divider 608, the second side 614 of the plenum divider 608, the first side 616 of the faceplate 610, the second side 618 of the faceplate 610, the tubular structure 632, the third holes 640, the first gas inlet 644, the second gas inlet 646, the third gas inlet 648, the radial gas distribution holes 650, the first low-thermal conductance barrier 654, the second low-thermal conductance barrier 656, the third low-thermal conductance barrier 657, the collar 670, the backplate 682, and the ring plate 692 of FIGS. 6A through 6D.

One area of difference between the showerhead 700 and the showerhead 600 is that the faceplate 710 and the faceplate cover 794 are constructed so as to prevent gas introduced into the internal flow passage(s) 774 via the third plenum volume from mixing with gas from the second plenum volume 704 within the showerhead 700.

These details may be more clearly observed with respect to FIG. 7C. As can be seen, the second through-holes 738 have contiguous interior surfaces 742 throughout the thickness of the faceplate 710 (including through the faceplate cover 794). Thus, gas flowing within the internal flow passage(s) 774 cannot escape via the second through-holes 738. Instead, separate fourth holes 776 may be provided to allow the gas flowing through the internal flow passages 774 to flow into the wafer reaction area.

To assist in visualizing gas flows within the showerhead, arrows indicating general directions of some gas flows have been added to FIG. 7C. For example, a first process gas delivered via the first plenum volume 702 is indicated with solid black arrows, a second process gas delivered via the second plenum volume 704 is indicated with white arrows, and a third process gas delivered via the third plenum volume 706 is indicated with grey arrows. As can be seen, the black arrows indicate flow through the first through-hole 736, the white arrows indicate flow through the annular space between the exterior surface 734 and the interior surface 742, and the grey arrows indicate flow through the fourth holes 776.

It is to be understood that in the examples above, the internal flow passage(s) have been described as a "contiguous open volume" or the like. In some implementations, the internal flow passages may be provided by a network of discrete passages (that may intersect or not intersect one another) within the faceplate. Such passages may be provided by gun-drilling or otherwise forming such passages through the width of the faceplate, or by machining or otherwise forming the passages in the faceplate and then covering the passages over with a faceplate cover. Similar strategies may also be adopted for cooling passages in the backplate or the plenum divider if such cooling passages are used.

Generally speaking, the gaps between the tubular structures described above and the interior surfaces of the second through-holes for a particular implementation may be subject to two constraints. The first is that the gap size, i.e., third distance, should generally be less than a distance that supports hollow cathode discharge. This constraint is generally only relevant when the showerhead will be subject to a plasma environment, e.g., such as may be produced with the showerhead 400, as the electric fields necessary to produce a capacitive discharge may otherwise not be present within the showerhead. Such gaps sizes may generally be less than about 0.1". The second constraint is that the gap size should be sized as is needed to establish a desired flow rate for the gas within the second plenum volume; this constraint may be highly process-specific. For example, the gap size may be determined based on parameters that provide a Peclet number that is high enough to substantially prevent back diffusion from one plenum into another plenum within the showerhead or from the wafer reaction area into one of the plenums, that provide a pressure drop that is sufficiently high that flow uniformity across the wafer is promoted, and that prevent or mitigate jetting effects during any process steps that may include plasma environments.

In some cases, the second through-holes may be augmented by additional through-holes of the same or different diameter that do not have corresponding tubular structures passing through them. These additional through-holes may allow for increased flow, or more distributed flow, of the gas from the second plenum volume. In the variants shown in FIGS. 5A through 7D, each first through-hole has a diameter of approximately 0.04", the outer diameters of the tubular structures are approximately 0.08", and the inner diameters of the second through-holes are approximately 0.125", leaving the third distance to be approximately 0.0225". These dimensions, however, may vary for different flow conditions.

The dual-temperature capability afforded by showerheads such as those disclosed herein may produce thermal environments that may vary drastically between the first plenum volume and the second plenum volume when used in some semiconductor processes. During some semiconductor processes, a significant amount of thermal energy may be produced in the wafer reaction area, and the faceplate, which, in effect, forms one boundary of the reaction area, may receive a substantial amount of heat energy during semiconductor processing. In a typical showerhead, such energy may be conducted from the faceplate via other showerhead components that are in conductive thermal contact with the faceplate. This may cause the remaining showerhead components to also rise in temperature and prevent a large temperature gradient between the faceplate and the remainder of the showerhead components from occurring.

In contrast, showerheads such as those disclosed herein may drastically reduce the amount of heat energy that flows from the faceplate and into the remaining showerhead components. This has two effects. The first is that the faceplate may remain at a significantly higher temperature as compared with a typical faceplate, i.e., a faceplate that is in thermal conductive contact with other components of the showerhead in a manner that does not significantly limit heat flow under normal process conditions. The other is that the remainder of the showerhead may be kept at a much cooler temperature than the remainder of the showerhead may be kept at in the typical case.

For example, in some atomic layer deposition (ALD)-type processes, the wafer reaction area can see temperatures that approach or exceed 500° C. A dual-temperature, multi-flow showerhead such as those described herein that is used in such ALD-type processes may thus exhibit faceplate temperatures of approximately 500° C. while exhibiting backplate temperatures of 25-30° C. (allowing the backplate to be hand-safe for human touch) during steady state process conditions. In some implementations, the backplate temperatures may range up to 70° C. In some other implementations, the faceplate temperatures may be maintained at 150 to 200° C. Typically, the temperature of the faceplate is driven by the temperature of the pedestal that supports the wafer, as well as other factors such as the plasma environment within the wafer reaction area.

By allowing the first plenum volume and the second plenum volume to be kept at two potentially very different temperatures, the showerheads disclosed herein may offer various benefits that may be of interest in various semiconductor processing contexts. For example, a plasma generated by either a plasma dome-type showerhead such as described herein, or a showerhead such as described herein that is connected with an external remote plasma generator, may produce radicals that are to be flowed across a semiconductor wafer. In travelling to the wafer reaction area, such radicals may collide with various surfaces within the showerhead; each such collision may result in the radical either ricocheting off of the surface or in the radical recombining with a molecule or atom on the surface. The recombined radicals reduce the radical yield that ultimately reaches the wafer reaction area. However, the chance of radical recombination is, among other things, at least partially dependent on the temperature of the environment within which the radical collision occurs—in hot environments, the chance of radical recombination increases, and in cold environments, the chance of radical recombination decreases. Thus, maintaining the first plenum volume at a significantly colder temperature may act to prevent unwanted radical recombination.

Another benefit to a low-temperature first plenum volume is that certain semiconductor processes utilize mutually reactive precursors that may react more slowly at colder temperatures than at hotter temperatures. For example, in an example ALD process, ammonia may be used in conjunction with a titanium species to provide a film deposition process. The ammonia may be provided via the first plenum volume (and kept a low temperature), and the titanium species may be provided via the second plenum volume (and kept at a high temperature). If, by chance, some titanium species happen to stray into the first plenum volume, e.g., via diffusion or other mechanism, the reaction rate of the titanium species with the ammonia will be reduced due to the lower temperature, reducing the amount of reaction byproducts that may be produced within the showerhead.

At the same time, maintaining the second plenum volume at a higher temperature (or, more specifically, the faceplate at a higher temperature), may help to prevent undesirable condensation of a process gas within the second plenum volume (such condensation may result in uneven gas distribution by clogging outlet orifices, or may result in droplets being ejected from the showerhead towards the wafer). Another benefit of maintaining the faceplate at an elevated temperature is that film flaking from the faceplate due to thermal cycling may be reduced or eliminated. This may reduce the risk of particulate contamination of the wafer.

The materials used for the various components herein may generally be selected from materials commonly used for semiconductor processing equipment, e.g., alloys or materials that are chemically compatible with the process environments used and that exhibit desired thermal, strength, and electrical properties. For example, the faceplate may be made from ceramic, aluminum, or other material. If made from ceramic, an electrode may be embedded within the ceramic to facilitate plasma generation within the wafer reaction area using the gases delivered to the wafer reaction area from the first plenum volume, the second plenum volume, and/or the third plenum volume.

It is to be understood that the showerheads described above may be implemented in the context of a semiconductor processing chamber (or reaction chamber) and/or tool, or in various stations of a multi-station processing or reaction chamber and/or tool. Such showerheads may be connected with various other pieces of equipment, such as gas supply sources/lines, flow controllers, valves, power supplies, RF generators, sensors such as pressure, temperature, or flow rate measurement devices, and so forth. Such chambers or tools may include a system controller having instructions for controlling the various valves, flow controllers, and other equipment to provide a desired semiconductor process using the showerhead. The instructions may include, for example, instructions to flow a first process gas through the first plenum volume and a second process gas through the second plenum volume simultaneously during process operations in accordance with the present disclosure. The system controller may typically include one or more memory devices and one or more processors configured to execute the instructions so that the apparatus will perform a method in accordance with the present disclosure. Machine-readable media containing instructions for controlling process operations in accordance with the present disclosure may be coupled to the system controller.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

It will also be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will therefore be further appreciated that the above description has been given by way of example only and that modifications in detail may be made within the scope of the disclosure.

The invention claimed is:

1. A showerhead for use in semiconductor processing equipment, the showerhead comprising:
   a first plenum volume;
   a second plenum volume;
   a faceplate;
   a plenum divider;
   one or more low-contact-area (LCA) features; and
   a first low-thermal-conductance barrier having an inner perimeter, wherein:
      the plenum divider has a first side and a second side opposite the first side of the plenum divider,
      the faceplate has a first side and a second side opposite the first side of the faceplate,
      the first side of the faceplate faces the second side of the plenum divider and is offset from the second side of the plenum divider by a first distance to form a first gap, the first side of the plenum divider partially bounds the first plenum volume, the second plenum volume is located between the plenum divider and the faceplate within the first gap, the plenum divider includes a plurality of tubular structures that protrude from the second side of the plenum divider by a second distance, each tubular structure having an exterior surface and a first through-hole passing through the tubular structure and the plenum divider and into the first plenum volume, the faceplate includes a plurality of second through-holes passing through the faceplate and into the second plenum volume, each second through-hole corresponding to a different one of the tubular structures and having an interior surface offset from the exterior surface of the corresponding tubular structure by at least a third distance, the first distance is less than the second distance, the faceplate is substantially conductively thermally isolated from the plenum divider, the one or more LCA features support the faceplate with respect to the plenum divider, the first low-thermal-conductance barrier is interposed between the faceplate and the plenum divider so as to span the first gap, and the first low-thermal-conductance barrier is positioned such that the second through-holes are located within the inner perimeter of the first low-thermal-conductance barrier.

2. The showerhead of claim 1, wherein:

the faceplate and the plenum divider are configured to have a thermal conductance of 0.05 W/(in$^2$K) or less between them.

3. The showerhead of claim 1, further comprising a backplate, wherein:

the first plenum volume is also partially bounded by the backplate, and the backplate includes internal cooling passages and is configured to be actively cooled.

4. The showerhead of claim 1, wherein the plenum divider includes one or more internal cooling passages configured to circulate coolant within the plenum divider.

5. The showerhead of claim 1, further comprising a plasma dome connected with a radio frequency generator and fluidly connected with a first gas inlet, wherein:

the first plenum volume is also partially bounded by the plasma dome, and the plasma dome and RF generator are configured to generate a plasma within the first plenum volume using gas from the first gas inlet.

6. The showerhead of claim 1, wherein:

the faceplate has a plurality of additional second through-holes in addition to the plurality of second through-holes, and the additional second through-holes do not have corresponding tubular structures.

7. The showerhead of claim 1, wherein the tubular structures are substantially cylindrical, the first through-holes and the second through-holes are substantially round, and the offset between the interior surface of each second through-hole and the exterior surface of each corresponding tubular structure results in an annular gap region between the second through-hole and the corresponding tubular structure.

8. The showerhead of claim 1, wherein the third distance is less than about 0.1".

9. The showerhead of claim 1, wherein the third distance is between about 0.005" and 0.020".

10. The showerhead of claim 1, wherein each tubular structure terminates at a location substantially even with the second side of the faceplate proximate to the corresponding second through-hole.

11. The showerhead of claim 1, further comprising: a first gas inlet; and a second gas inlet, wherein: the first gas inlet is configured to supply gas to the first plenum volume, the second gas inlet is configured to supply gas to the second plenum volume, the second gas inlet is substantially tubular, passes through the plenum divider, and spans between the first side of the faceplate and the second side of the plenum divider, the second gas inlet has a circular array of radial gas distribution holes, each radial gas distribution hole fluidly connecting the second gas inlet with the second plenum volume.

12. The showerhead of claim 1, wherein the first low-thermal-conductance barrier has a serpentine cross-section in a plane perpendicular to the faceplate with a serpentine length that is greater than the first distance.

13. The showerhead of claim 1, wherein substantially all of the thermally conductive paths from the faceplate to other components of the showerhead are provided by the one or more LCA features and the first low-thermal-conductance barrier.

14. The showerhead of claim 1, wherein the one or more LCA features are provided by a plurality of posts spaced about the first low-thermal-conductance barrier, the posts configured to support the faceplate in tension.

15. The showerhead of claim 1, further including a collar having an interior collar surface that is offset from the faceplate by at least a fourth distance and having an interior aperture smaller than the faceplate, wherein the one or more LCA features are provided by a plurality of LCA balls that support the second side of the faceplate in compression, the LCA balls located between the interior collar surface and the faceplate.

16. The showerhead of claim 1, further comprising a second low-thermal-conductance barrier having an inner perimeter, wherein:

the second low-thermal-conductance barrier is interposed between the faceplate and the plenum divider so as to span the first gap, and the first low-thermal-conductance barrier is located within the inner perimeter of the second low-thermal-conductance barrier.

17. The showerhead of claim 16, wherein substantially all of the thermally-conductive paths from the faceplate to other components of the showerhead are provided by the one or more LCA features, the first low-thermal-conductance barrier, and the second low-thermal-conductance barrier.

18. The showerhead of claim 16, wherein:

a third plenum volume is at least partially defined by the first side of the faceplate, the second side of the plenum divider, the first low-thermal-conductance barrier, and the second low-thermal-conductance barrier;

the faceplate includes:

a plurality of internal flow passages, and a plurality of third holes in the first side of the faceplate, wherein:

each third hole spans between one of the internal flow passages and the first side of the faceplate; and each third hole exits the first side of the faceplate in a region between the first low-thermal-conductance barrier and the second low-thermal-conductance barrier.

19. The showerhead of claim 18, wherein the first plenum volume, the second plenum volume, and the third plenum volume are all fed from separate gas inlets.

20. The showerhead of claim 18, wherein the second through-holes intersect the internal flow passages and the second through-holes are thereby in fluidic communication with the internal flow passages within the faceplate.

21. The showerhead of claim 18, wherein the faceplate further includes a plurality of fourth holes in the second side of the faceplate, wherein:
   each fourth hole spans between one of the internal flow passages and the second side of the faceplate.

22. The showerhead of claim 21, wherein the fourth holes are fluidly isolated from the second through-holes within the faceplate.

23. A semiconductor processing apparatus comprising:
   a reaction chamber;
   a wafer support; and
   a showerhead including:
      a first plenum volume;
      a second plenum volume;
      a faceplate;
      a plenum divider;
      one or more low-contact-area (LCA) features; and
      a first low-thermal-conductance barrier having an inner perimeter, wherein:
         the plenum divider has a first side and a second side opposite the first side of the plenum divider,
         the faceplate has a first side and a second side opposite the first side of the faceplate,
         the first side of the faceplate faces the second side of the plenum divider and is offset from the second side of the plenum divider by a first distance to form a first gap,
         the first side of the plenum divider partially bounds the first plenum volume,
         the second plenum volume is located between the plenum divider and the faceplate within the first gap,
         the plenum divider includes a plurality of tubular structures that protrude from the second side of the plenum divider by a second distance, each tubular structure having an exterior surface and a first through-hole passing through the tubular structure and the plenum divider and into the first plenum volume,
         the faceplate includes a plurality of second through-holes passing through the faceplate and into the second plenum volume, each second through-hole corresponding to a different one of the tubular structures and having an interior surface offset from the exterior surface of the corresponding tubular structure by at least a third distance,
         the first distance is less than the second distance,
         the faceplate is substantially conductively thermally isolated from the plenum divider,
         the one or more LCA features support the faceplate with respect to the plenum divider,
         the first low-thermal-conductance barrier is interposed between the faceplate and the plenum divider so as to span the first gap, and
         the first low-thermal-conductance barrier is positioned such that the second through-holes are located within the inner perimeter of the first low-thermal-conductance barrier, wherein:
            the semiconductor processing apparatus is configured such that the second side of the faceplate of the showerhead faces the wafer support, and
            the wafer support is configured to support a semiconductor wafer within the reaction chamber.

24. A semiconductor processing tool comprising:
one or more reaction chambers, at least one reaction chamber having a wafer support and a showerhead, the showerhead including:
   a first plenum volume;
   a second plenum volume;
   a faceplate;
   a plenum divider;
   one or more low-contact-area (LCA) features; and
   a first low-thermal-conductance barrier having an inner perimeter, wherein:
      the plenum divider has a first side and a second side opposite the first side of the plenum divider,
      the faceplate has a first side and a second side opposite the first side of the faceplate,
      the first side of the faceplate faces the second side of the plenum divider and is offset from the second side of the plenum divider by a first distance to form a first gap,
      the first side of the plenum divider partially bounds the first plenum volume,
      the second plenum volume is located between the plenum divider and the faceplate within the first gap,
      the plenum divider includes a plurality of tubular structures that protrude from the second side of the plenum divider by a second distance, each tubular structure having an exterior surface and a first through-hole passing through the tubular structure and the plenum divider and into the first plenum volume,
      the faceplate includes a plurality of second through-holes passing through the faceplate and into the second plenum volume, each second through-hole corresponding to a different one of the tubular structures and having an interior surface offset from the exterior surface of the corresponding tubular structure by at least a third distance,
      the first distance is less than the second distance,
      the faceplate is substantially conductively thermally isolated from the plenum divider,
      the one or more LCA features support the faceplate with respect to the plenum divider,
      the first low-thermal-conductance barrier is interposed between the faceplate and the plenum divider so as to span the first gap, and
      the first low-thermal-conductance barrier is positioned such that the second through-holes are located within the inner perimeter of the first low-thermal-conductance barrier, wherein:
         the semiconductor processing tool is configured such that the second side of the faceplate of the showerhead faces the wafer support, and
         the wafer support is configured to support a semiconductor wafer within the at least one reaction chamber.

* * * * *